(12) United States Patent
Suzuki

(10) Patent No.: US 7,611,952 B2
(45) Date of Patent: Nov. 3, 2009

(54) METHOD OF MANUFACTURING SEMICONDUCTOR DEVICE HAVING SIDE WALL SPACERS

(75) Inventor: Tamito Suzuki, Fukuroi (JP)

(73) Assignee: Yamaha Corporation, Shizuoka-Ken (JP)

( * ) Notice: Subject to any disclaimer, the term of this patent is extended or adjusted under 35 U.S.C. 154(b) by 0 days.

(21) Appl. No.: 11/330,264

(22) Filed: Jan. 12, 2006

(65) Prior Publication Data

US 2006/0157752 A1 Jul. 20, 2006

(30) Foreign Application Priority Data

Jan. 14, 2005 (JP) .............................. 2005-007286

(51) Int. Cl.
*H01L 21/336* (2006.01)
(52) U.S. Cl. .............................. 438/303; 257/E21.626; 257/E21.64
(58) Field of Classification Search ................. 438/303; 257/E21.626, E21.64
See application file for complete search history.

(56) References Cited

U.S. PATENT DOCUMENTS 5,405,488 A * 4/1995 Dimitrelis et al. ............. 216/60
6,025,267 A * 2/2000 Pey et al. ..................... 438/656
2003/0109089 A1* 6/2003 Mitros et al. ................ 438/197

FOREIGN PATENT DOCUMENTS

| JP | 05-102089 | 4/1993 |
| JP | 07-273097 | 10/1995 |

* cited by examiner

*Primary Examiner*—Lex Malsawma
(74) *Attorney, Agent, or Firm*—Dickstein Shapiro LLP

(57) ABSTRACT

Gate insulating films 12A and 12B of different thickness are formed in element openings 16a and 16b in the isolation film 16 of a wafer 10. The gate insulating film 12B is the thinnest gate insulating film. A dummy insulating film having the same thickness as the thinnest gate insulating film 12B is formed in wafer periphery area WP. Gate electrodes 20A and 20B are formed on the gate insulating films 12A and 12B, and thereafter an insulating film is deposited on the wafer surface. The deposited insulating film is dry-etched to form side wall spacers 22a to 22d on side walls of the gate electrodes 20A and 20B. During dry etching, the time when the semiconductor surfaces are exposed in the element opening 16b and area WP is detected as an etching end point by a change in the emission spectrum intensity of etching byproducts.

11 Claims, 20 Drawing Sheets

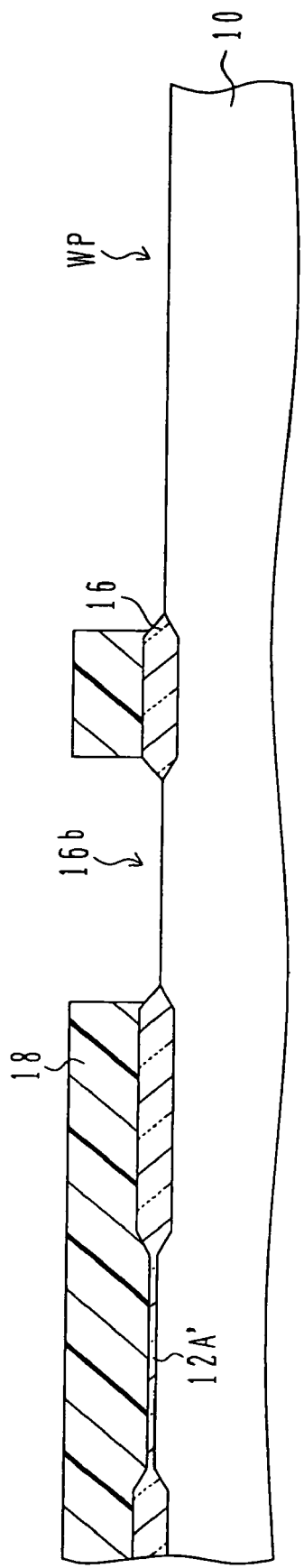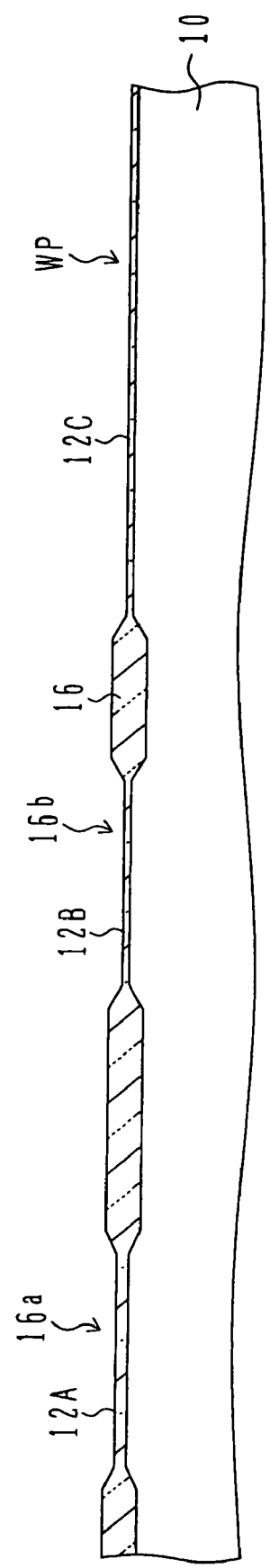

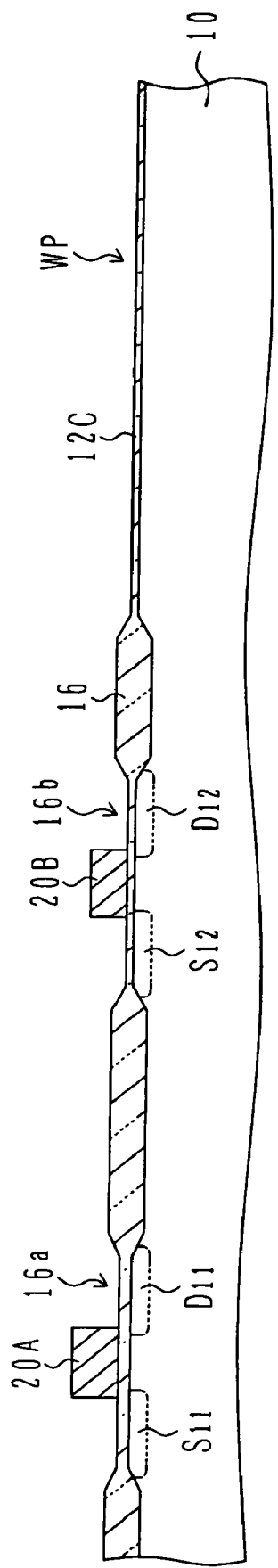
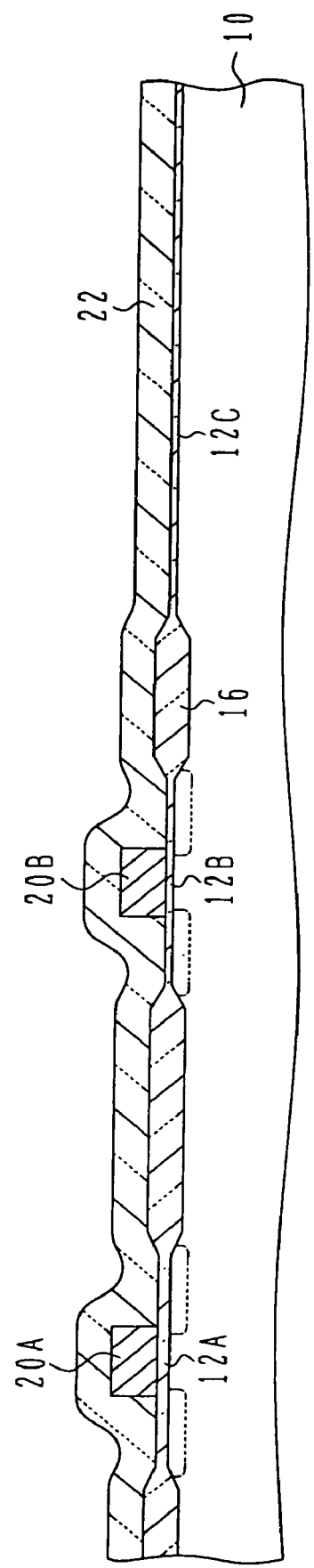

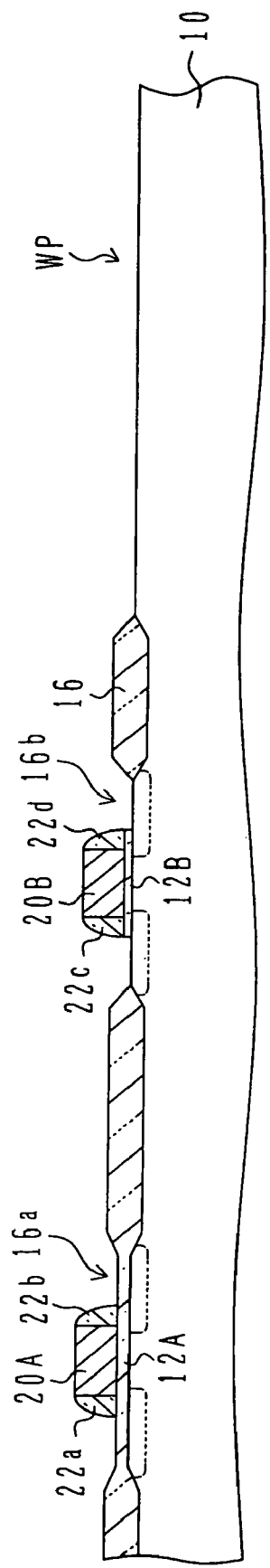
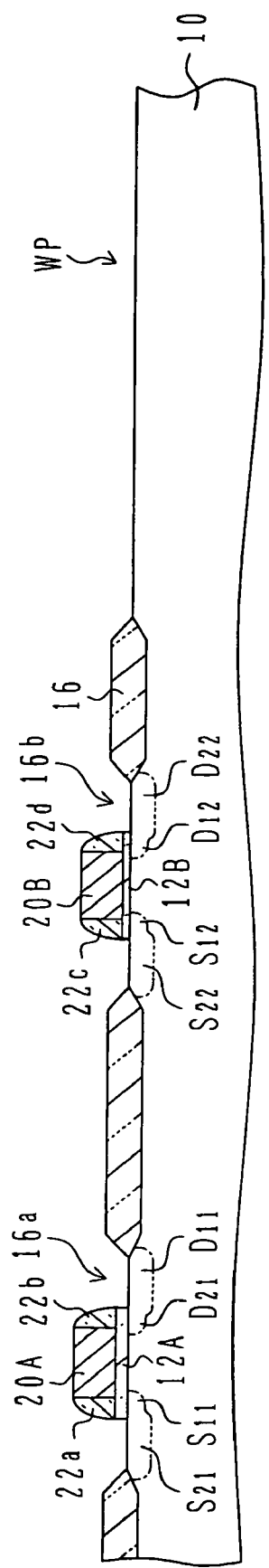

| CONDITIONS | CHIP SIZE (μm) | NUMBER OF PADS (PADS/CHIP) | PAD SIZE (μm) | INCREASE (%) |
|---|---|---|---|---|
| 1 | 5000 | 16 | 100 | 0.6 |
| 2 | 4500 | 16 | 100 | 0.7 |
| 3 | 3000 | 16 | 100 | 1.6 |
| 4 | 2500 | 16 | 100 | 2.3 |
| 5 | 2000 | 16 | 100 | 3.6 |
| 6 | 1500 | 16 | 100 | 6.4 |
| 7 | 1000 | 16 | 100 | 14.4 |
| 8 | 3000 | 15 | 100 | 1.5 |
| 9 | 3000 | 20 | 100 | 2.0 |
| 10 | 3000 | 25 | 100 | 2.5 |
| 11 | 3000 | 30 | 100 | 3.0 |
| 12 | 3000 | 35 | 100 | 3.5 |
| 13 | 3000 | 40 | 100 | 4.0 |
| 14 | 3000 | 45 | 100 | 4.5 |

FIG.11
CONVENTIONAL
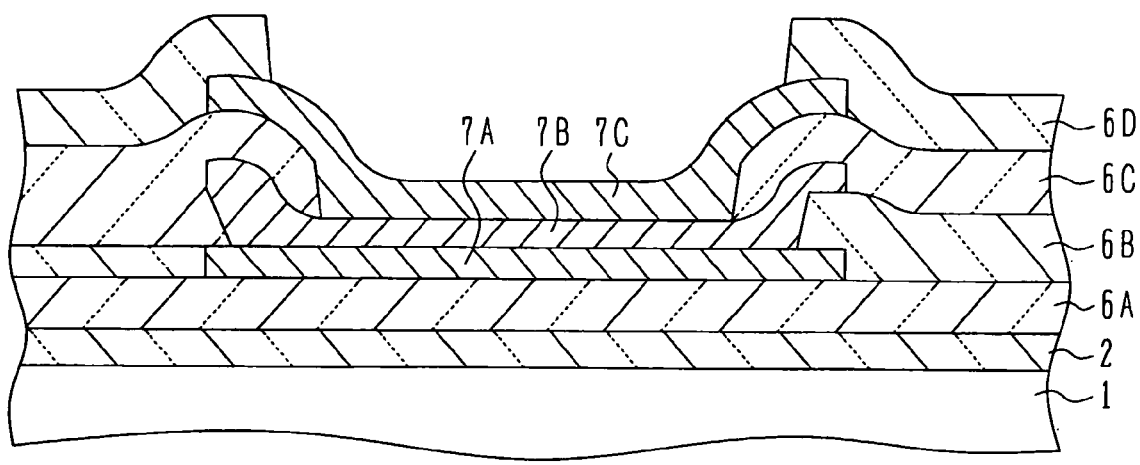

US 7,611,952 B2

METHOD OF MANUFACTURING SEMICONDUCTOR DEVICE HAVING SIDE WALL SPACERS

CROSS REFERENCE TO RELATED APPLICATION

This application is based on and claims priority of Japanese Patent Application No. 2005-007286 filed on Jan. 14, 2005, the entire contents of which are incorporated herein by reference.

BACKGROUND OF THE INVENTION

A) Field of the Invention

The present invention relates to a semiconductor device manufacture method, and more particularly to a method of manufacturing a semiconductor device having side wall spacers.

B) Description of the Related Art

Dry etching is performed by using etching gas in plasma state. By monitoring emission of etching byproducts, etching can be monitored. As an etching object is completely removed, emission by etching byproducts of the etching object extinguishes. Even if the etching object is not completely removed, if the area of the etching object is reduced, the emission intensity lowers.

In most of manufacture processes for a MOS transistor, a gate electrode of polysilicon is formed on a gate oxide film on a silicon substrate, shallow and low concentration source/drain regions (lightly doped drain, LDD) or extension regions are formed by ion implantation, side wall spacers of silicon oxide are formed on the side walls of the gate electrode, thereafter deep and high concentration source/drain regions are formed by ion implantation. The side wall spacers are formed in the following manner. A silicon oxide film is formed on the whole surface of the semiconductor substrate and anisotropically etched to remove the silicon oxide film on flat surfaces and leave the silicon oxide film only on the side walls of the gate electrode. If etching continues after the silicon oxide film is etched, or in some cases, after the gate insulating film under the silicon oxide film is etched and the silicon substrate is exposed, the surface of the silicon substrate is damaged. It is desired to detect an etching end point when the silicon substrate surface is exposed, to thereby control the etching.

JP-A-HEI-5-102089 publication discloses that emission of carbon monoxide (CO) can be utilized as etching monitor if a silicon oxide film is etched by etching gas not containing oxygen but containing fluorocarbon. For example, emission having peak wavelengths of 211.2 nm, 219.0 nm, 230.0 nm and 232.5 nm can be observed during etching silicon oxide, and cannot be observed during etching Si. An etching end point can be monitored because it is possible to observe a reduction in an emission intensity caused by a reduction in a silicon oxide surface area per unit area.

SUMMARY OF THE INVENTION

An object of the present invention is to provide a semiconductor device manufacture method capable of forming side wall spacers with good controllability.

Another object of the present invention is to provide a semiconductor device manufacture method capable of monitoring etching at a high precision.

According to one aspect of the present invention, there is provided a semiconductor device manufacture method comprising the steps of: (a) forming an isolation region in an area other than a plurality of active regions and dummy regions of a semiconductor substrate; (b) forming thin insulating films on said active regions and dummy regions; (c) forming a gate electrode on the thin insulating films in said active regions; (d) implanting impurity ions in said active regions by using said gate electrodes as a mask to form shallow source/drain regions; (e) depositing a spacer insulating film on said semiconductor substrate, said spacer insulating film covering said gate electrodes; (f) anisotropically etching said spacer insulating film, detecting as an etching end point a time when surfaces of said semiconductor substrate are exposed in said active regions and dummy regions, and leaving side wall spacers on side walls of each of said gate electrodes; and (g) implanting impurity ions into said active regions by using said gate electrodes and side wall spacers as a mask to form low resistivity and deep source/drain regions in said active regions.

BRIEF DESCRIPTION OF THE DRAWINGS

FIGS. 1A to 1I are cross sectional views illustrating main processes of a semiconductor device manufacture method according to a first embodiment of the present invention.

FIG. 11 is a cross sectional view showing an example of a conventional pad electrode structure.

DESCRIPTION OF THE PREFERRED EMBODIMENTS

Prior to describing embodiments, research made by the present inventor will be described.

According to the research made by the present inventor, it has been found that stability of detecting an etching end point is poor if an etching end point detecting method of monitoring an emission spectrum intensity of etching byproducts such as CO is adopted in a side wall spacer forming process of a method of manufacturing a MOS LSI containing a plurality of types of transistors having different gate insulting film thickness.

Figure 9A:
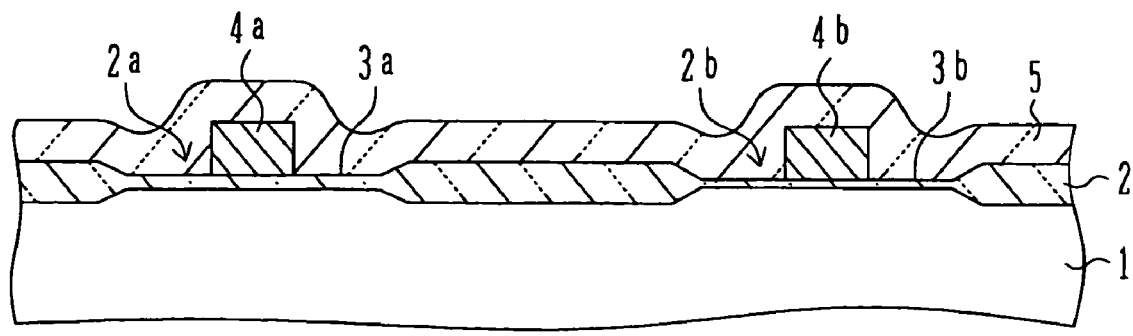
FIGS. 9A to 9D are cross sectional views illustrating main processes of a side wall spacer forming method according to the research made by the present inventor.
Figure 9B:
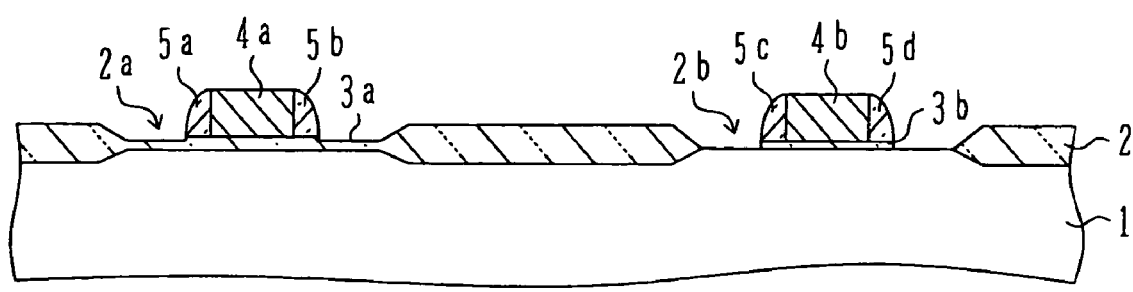

FIGS. 9A and 9B illustrate a side wall spacer forming method according to the research made by the present inventor. In a process shown in FIG. 9A, an isolation film (field insulating film) 2 made of a silicon oxide film and having element openings (active regions) 2a and 2b is formed in a surface layer of a semiconductor substrate 1 made of silicon, by local oxidation of silicon (LOCOS). A gate oxide film 3a made of a silicon oxide film having a thickness of, e.g., 80 nm is formed on the semiconductor surface exposed in the element opening 2a, and a gate oxide film 3b made of a silicon oxide film having a thickness of, e.g., 20 nm is formed on the semiconductor surface exposed in the element opening 2b, respectively by thermal oxidation process. A conductive layer of low resistance polysilicon or the like is deposited on the substrate upper surface and then patterned by photolithography and dry etching processes to form gate electrode layers 4a and 4b on the gate insulating films 3a and 3b. An insulating film 5 made of silicon oxide is formed on the insulating films 2, 3a and 3b by chemical vapor deposition (CVD), covering the electrode layers 4a and 4b.

Next, in the process shown in FIG. 9B, the insulating film 5 is etched back by dry etching process to form side wall spacers 5a and 5b on both sides of the electrode layer 4a, and side wall spacers 5c and 5d on both sides of the electrode layer 4b. All the side wall spacers 5a to 5d are made of left portions of the insulating film 5. In this dry etching process, the insulating films 2, 3a and 3b are also etched which are exposed while the side wall spacers 5a to 5d are formed.

In the dry etching process shown in FIG. 9B, the time when the semiconductor surface is exposed in the element opening 2b is detected as an etching end point in accordance with a change in an emission spectrum intensity of etching byproducts.

Figure 10:
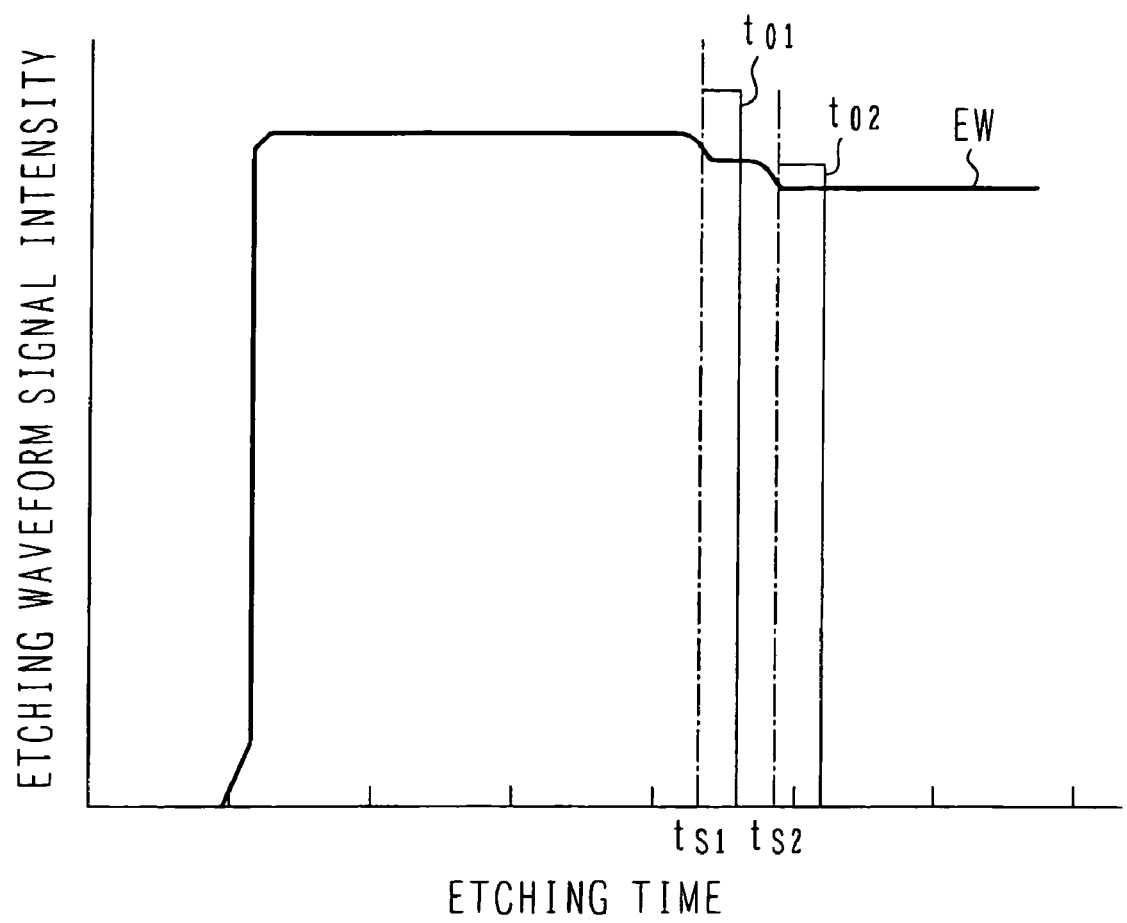
FIG. 10 is a graph showing a time change in an emission intensity detected with an etching monitor.

FIG. 10 shows a relation between an etching time and an intensity of an etching waveform signal EW. The time $t_{S1}$ indicates when an etching end point of the thin insulating film 3b is detected. In the example shown in FIG. 9B, over-etching is performed by continuing the dry etching process for the time corresponding to 10% of the etching time till the insulating film 3b is etched after the etching end point of the thin insulating film 3b is detected at the time $t_{S1}$. In FIG. 10, the over-etching end time is also indicated by $t_{O1}$.

Figure 9C:
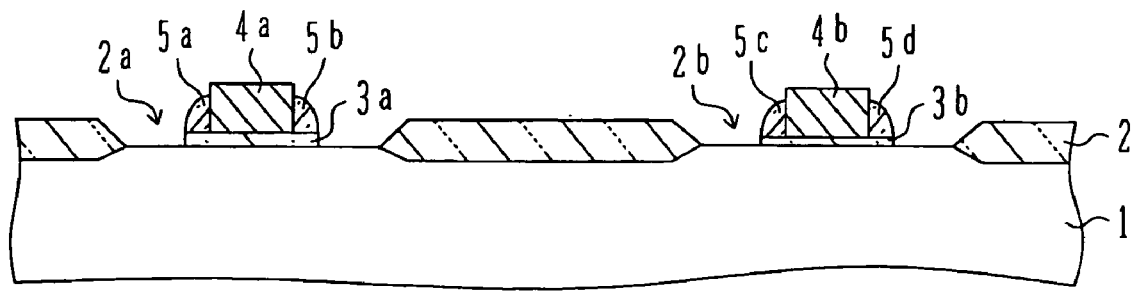

FIG. 9C shows an example wherein the etching end point of the thin insulating film 3b is not detected but the etching end point of the thick insulating film 3a is detected, and over-etching is performed thereafter for the time corresponding to 10% of the etching time till the insulating film 3a is etched. The etching end point detection time $t_{S2}$ and the over-etching end time $t_{O2}$ are also shown in FIG. 10. As seen from FIG. 9C, the side wall spacers 5a to 5d are excessively etched. Since the insulating film 3a is thicker by 80−20=60 nm than the insulating film 3b, the etching amount of the side wall spacers 5a to 5d increases in correspondence with the etching amount of the insulating film 3a.

Figure 9D:
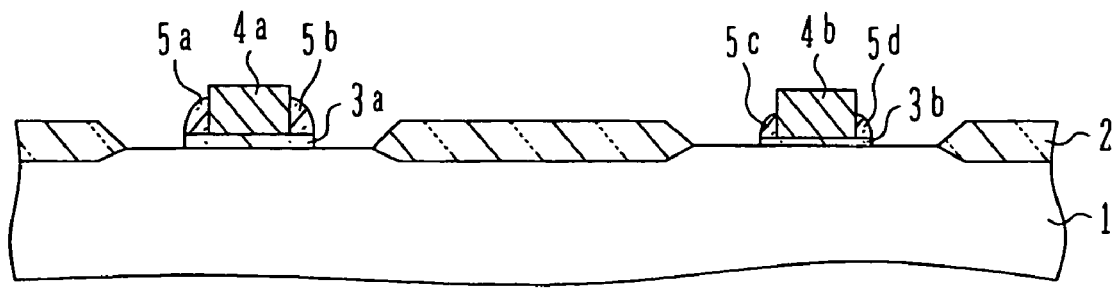

FIG. 9D shows an example wherein the etching end points of both the thick and thin insulating films 3a and 3b are not detected (i.e., an etching end point detection error) and the etching progresses until a longest allowable time. In this example, it can be seen that all the side wall spacers 5a to 5d are excessively etched. The sizes of all the side wall spacers 5a to 5d are reduced in the order of FIGS. 9B, 9C and 9D as the etching progresses.

In forming MOS transistors of a lightly doped drain (LDD) structure in the element openings 2a and 2b, before the insulating film 5 is formed in the process shown in FIG. 9A, shallow and low impurity concentration source/drain regions are formed in the element openings 2a and 2b. After the processes shown in FIGS. 9A and 9B, deep and high impurity concentration source/drain regions are formed in the element openings 2a and 2b. Thereafter, an interlayer insulating film 6A is formed on the substrate 1 (shown in FIG. 11), covering the MOS transistors in the element openings 2a and 2b.

FIG. 11 shows a conventional pad electrode structure formed in a peripheral area of a chip area, of the substrate in a wafer state, in which the transistors in the element openings 2a and 2b are formed. After the interlayer insulating film 6A is formed, a first-layer metal wiring layer 7A, an interlayer insulating film 6B, a second-layer metal wiring layer 7B, an interlayer insulating film 6C, a metal electrode layer 7C and a protective insulating film 6D are formed sequentially on the insulating film 6A by well-known methods. The wiring layers 7A and 7B and electrode layer 7C constitute a pad electrode to be connected to a bonding wire or the like.

According to the side wall spacer forming method described above, the etching end point detection is done for either the insulating film 3a or insulating film 3b or fails, as shown in FIG. 9B to 9D. Therefore, variations in size and shape of the side wall spacers 5a to 5d become large and manufacture yield lowers. The reasons of poor stability of the etching end point detection are considered as follows.

Figure 2A:
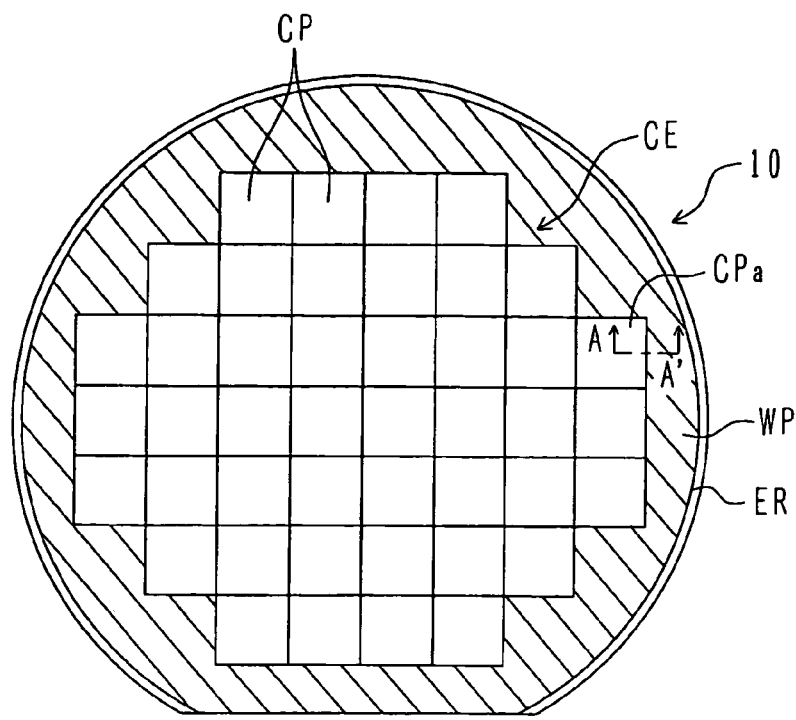
FIGS. 2A and 2B are plan views showing an example of the structure of a semiconductor wafer.

The dry etching process for forming side wall spacers is executed on the whole surface of a wafer (substrate). Most of the wafer surface are covered with the isolation film 2. For example, in a wafer such as shown in FIG. 2A, the isolation film covers an wafer periphery area WP between a wafer edge and a chip exposure area CE including a number of chip areas CP. In each chip area, the isolation film also covers the semiconductor surface, e.g. under the pad electrode as shown in FIG. 11. The area of the wafer surface to be opened by the dry etching process is only an area of the thin gate insulating film corresponding to the source/drain regions such as shown in 9B and an area of the thick gate insulating film corresponding to the source/drain regions such as shown in FIG. 9C. A ratio of an etched opening area to a principal area of a wafer is called an "etched opening area ratio". If the etched opening ratios when the thin gate insulating film such as shown in FIG. 9B is etched and when the thick gate insulating film such as shown in FIG. 9C is etched are both small, an etching waveform signal used for etching end point detection has a small intensity change as shown in FIG. 10 so that a precision of etching end point detection lowers. For example, in the case of an automatic etching end point detecting apparatus installed at present manufacture facilities, if the etched opening area ratio is not 15% or higher, it is difficult to realize stable etching end point detection suitable for mass production.

It is desired to raise a detection precision of an etching end point. The present inventor has thought of increasing an etching object area. Particularly, when there are gate insulating films of different thickness, there is a large possibility that an area of active regions where the thinnest gate insulating film is formed is considerably limited. In a semiconductor wafer, there are an area where chips cannot be formed, an inter-cell area in a chip when cells are disposed in a chip, an isolation area remote from active regions, an area (including a scribe area) between areas where chip structures constituting a circuit are formed, an area which is not required to form an isolation region although a constituent element is formed, such as a pad area and a bump area. If the insulating film same as the gate insulating film, etching of which is to be detected, is formed in these areas, the monitor area can be increased considerably.

For example, in a peripheral area of a principal surface of a semiconductor wafer between the chip area and the area near an outer circumferential edge (resist edge rinse area) of the substrate, after a peripheral oxidation mask layer is removed, a thinnest dummy insulating film is formed, which has almost the same thickness as that of the thinnest gate insulating film, if a plurality of gate insulating films of different thickness are formed. When there is only one kind of gate insulating film, it is the thinnest gate insulating film.

In a dry etching process of forming side wall spacers, the time when the semiconductor surfaces under the thinnest gate insulating film and thinnest dummy insulating film are exposed is detected as an etching end point in accordance with a change in an emission spectrum intensity of etching byproducts. In this case, since the etched opening area is broadened (the etched opening area ratio is made large) by the area where the thinnest dummy insulating film was formed, a change in the etching waveform signal intensity becomes large so that an etching end point can be detected at a high precision. Since the thinnest dummy insulating film is formed in the peripheral area of the substrate outside the chip area, the device performance of MOS transistors and the like will not be adversely affected.

If this side wall spacer forming method is to be executed, resist exposure is not performed in the peripheral area of the substrate in the isolation process to leave the oxidation mask layer such as a silicon nitride film. The left oxidation mask prevents growth of the isolation film. Thereafter, in the processes of forming gate insulating films having different thickness, the thinnest dummy insulating film is formed in the peripheral area of the substrate. It is therefore unnecessary to add an exposure mask and can avoid a cost increase.

Alternatively, in a predetermined area of a chip area of the principal surface of a semiconductor wafer spaced apart by a predetermined distance or more from an area where a plurality of MOS transistors are to be formed, an in-chip oxidation mask layer is limited and thereafter the thinnest dummy insulating film is formed which has almost the same thickness as that of the thinnest gate insulating film. Similar to the side wall spacer forming method described above, the etching end point is detected for the thinnest gate insulating film and thinnest dummy insulating film. In this case, since the etched opening area is broadened by the area where the thinnest dummy insulating film was formed, an etching end point can be detected at a high precision. Since the thinnest dummy insulating film is formed in the predetermined area of the chip area spaced apart from the area where a plurality of MOS transistors are to be formed and the isolation film is formed in the spacing area, the device performance of MOS transistors and the like will not be adversely affected.

During a predetermined period after the etching end point is detected, the dry etching process may be continued to etch the exposed areas of gate insulating films other than the thinnest gate insulating film. In this case, an etching amount of each gate insulating film thicker than the thinnest gate insulating film can be controlled precisely by using as the criterion the etching end point detected for the thinnest gate insulating film.

In another example, in a predetermined area between adjacent chip areas on the principal surface of a semiconductor wafer, an inter-chip oxidation mask layer is removed and thereafter the thinnest dummy insulating film is formed which has almost the same thickness as that of the thinnest gate insulating film. Similar to the side wall spacer forming method described above, in the dry etching process of forming side wall spacers, the etching end point is detected for the thinnest gate insulating film and thinnest dummy insulating film. In this case, since the etched opening area is broadened by the area where the thinnest dummy insulating film was formed, an etching end point can be detected at a high precision. Since the thinnest dummy insulating film is formed in the predetermined area (including scribe area) between adjacent chip areas, the device performance of MOS transistors and the like will not be adversely affected.

During a predetermined period after the etching end point is detected, the dry etching process may be continued to etch the exposed areas of gate insulating films other than the thinnest gate insulating film. In this case, an etching amount of each gate insulating film thicker than the thinnest gate insulating film can be controlled precisely by using as the criterion the etching end point detected for the thinnest gate insulating film.

Since the etched opening area is broadened by additionally forming the thinnest dummy insulating film having almost the same thickness as that of the thinnest gate insulating film, the etching end point can be detected precisely in the dry etching process of forming side wall spacers and the manufacture yield can be improved through stable etching end point detection.

Furthermore, since the etching end point can be detected at a good precision, an over-etching amount can be adjusted for each wafer in accordance with variation in film thickness of respective wafers and variation in etching rates of an etching system of single wafer processing. It is therefore possible to stabilize the quality of semiconductor devices. Now, embodiments of the invention will be described.

FIGS. 1A to 1H illustrate a side wall spacer forming method according to an embodiment of the present invention. Each cross sectional view of a semiconductor device 10 shown in FIGS. 1A to 1H corresponds to the cross sectional view of a wafer-state semiconductor substrate shown in FIG. 2A taken along line A-A'.

As shown in FIG. 2A, chip exposure area CE including a number of chip areas CP to be separated from the substrate (wafer) 10 as semiconductor chips is defined on a principal surface (upper surface) of the substrate 10. An area near the circumferential edge of the wafer is defined as a resist edge rinse area ER. The resist edge rinse area ER is an area where resist is removed by a resist rinse process in order to prevent resist drop or overhang of a resist layer formed on the wafer 10 by a photolithography process. An area (hatched area) between the chip exposure area CE and resist edge rinse area ER is defined as wafer periphery area WP. A cross section taken along line A-A' of FIG. 2A is a cross section of an inner area from one chip area CPa among a number of chip areas to the wafer periphery area WP.

Figure 1A:
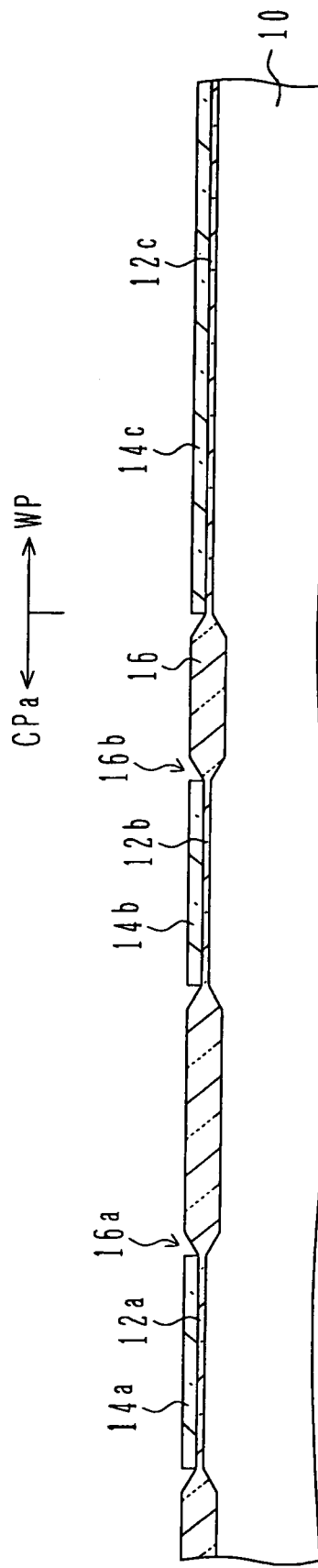

In a process shown in FIG. 1A, a silicon oxide film having a thickness of about several tens nm is formed on the upper surface of a semiconductor substrate 10 by thermal oxidation, and thereafter a silicon nitride film having a thickness of about one hundred and several tens nm is formed on the silicon oxide film by CVD. The silicon nitride film is patterned by photolithography and etching to form oxidation mask layers 14a to 14c made of left portions of the silicon nitride film. The oxidation mask layers 14a and 14b cover the areas where first and second MOS transistors are to be formed, and the oxidation mask layer 14c covers an wafer periphery area WP shown in FIG. 2A. Insulating films 12a, 12b and 12c are made of the silicon oxide film covered with the oxidation mask layers 14a, 14b and 14c.

Next, isolation films 16 of silicon oxide are formed by selective oxidation using the oxidation mask layers 14a to 14c. For example, a thickness of the insulating film 16 may be 250 nm. Thereafter, the oxidation mask layers 14a to 14c are removed by hot phosphoric acid or the like. The insulating film 16 is therefore left as having device holes 16a and 16b corresponding the areas where first and second MOS transistors are to be formed. The insulating films 12a and 12b are left covering the semiconductor surfaces in the element openings 16a and 16b, and the insulating film 12c is left covering the wafer periphery area WP.

Figure 1B:
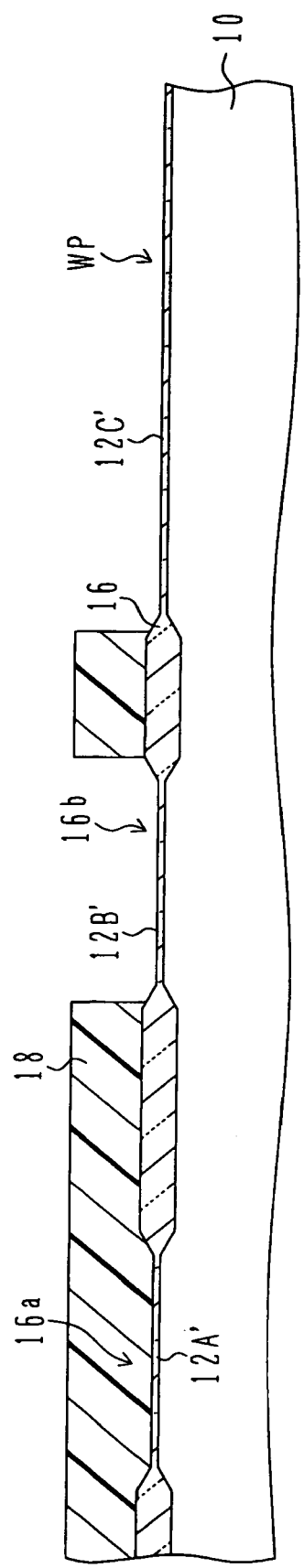
Figure 1I:
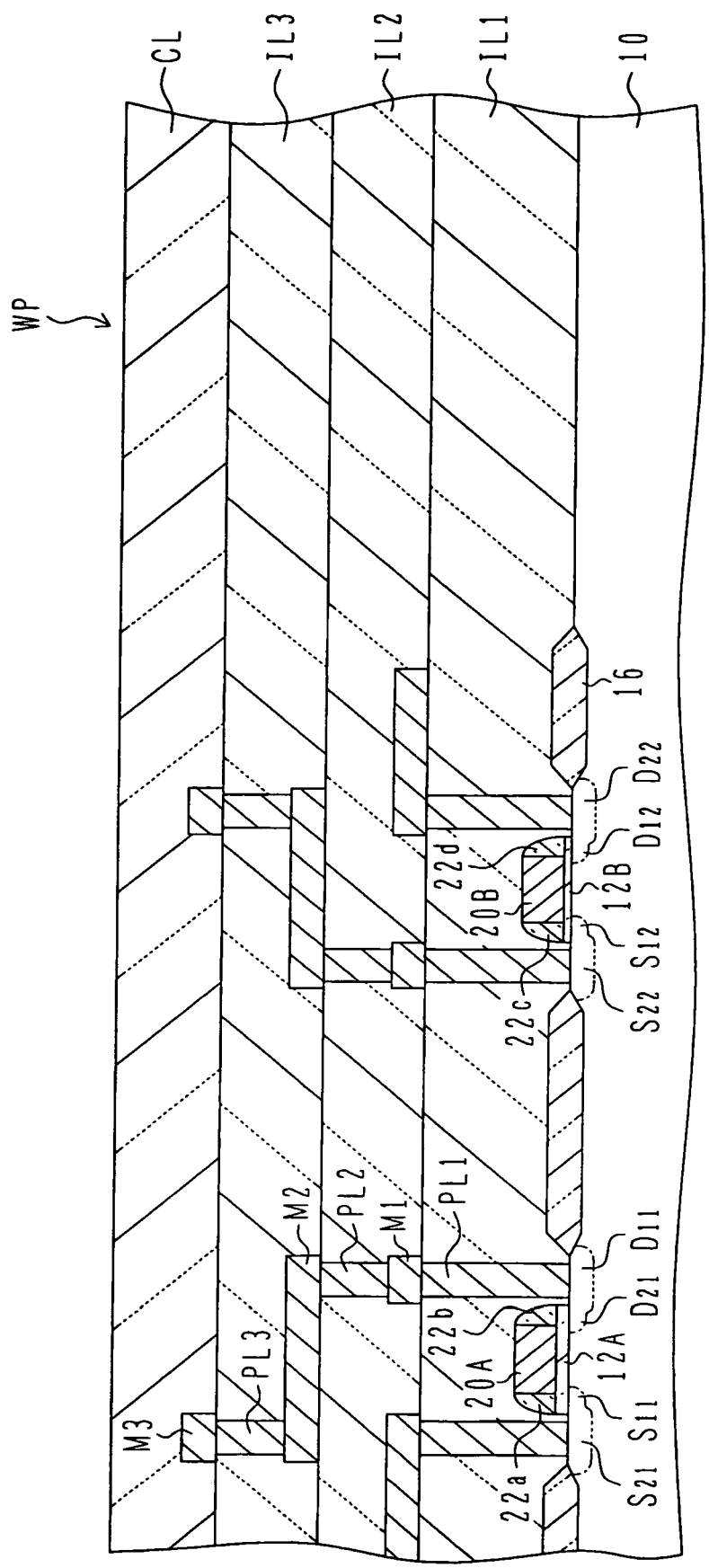

FIGS. 1B, 1C and 1D illustrate processes of forming gate insulating films having different thickness. In the process shown in FIG. 1B, after the insulating films 12a to 12c are removed, insulating films 12A' to 12C' made of clean silicon oxide films are formed by thermal oxidation in the areas where the insulating films 12a to 12c were removed. A resist layer 18 is deposited on the upper surface of the substrate 10 by photolithography, covering the insulating films 12A' and 16 and exposing the insulating films 12B' and 12C'. In the process shown in FIG. 1C, by using the resist layer 18 as a mask, the insulating films 12B' and 12C' are removed by wet etching using hydrofluoric acid. The semiconductor surfaces are therefore exposed in the element opening 16b and in the wafer periphery area WP. The resist layer 18 is thereafter removed.

In the process shown in FIG. 1D, a gate insulating film 12B made of a silicon oxide film and having a thickness of, e.g., 20 nm is formed by thermal oxidation on the semiconductor surface in the element opening 16b, and a dummy insulating film 12C made of a silicon oxide film having almost the same thickness as that of the gate insulating film 12B is formed at the same time on the wafer surface in the wafer periphery area WP. This thermal oxidation grows the silicon oxide film constituting the insulating film 12A' to a thickness of, e.g., 80 nm to form a gate insulating film 12A made of the silicon oxide film. Since the insulating film 12B is the thinnest gate insulating film in the chip area CPa, the insulating film 12C having almost the same thickness as that of the thinnest gate insulating film is called a "thinnest dummy insulating film".

In the process shown in FIG. 1E, a conductive layer of low resistance polysilicon or the like is formed on the substrate upper surface by CVD, and thereafter patterned by photolithography and etching to form gate electrode layers 20A and 20B made of left portions of the conductive layer on the gate insulating films 12A and 12B. By using as a mask a resist layer covering the insulating film 16, gate electrode layer 20B, element opening 16b and wafer periphery area WP, impurity ions are implanted to form low impurity concentration source/drain regions $S_{11}$ and $D_{11}$ having a conductivity type opposite to that of the substrate 10. After the resist layer used for this process is removed, by using as a mask a resist layer covering the insulating film 16, gate electrode layer 20A, element opening 16a and wafer periphery area WP, impurity ions are implanted to form low impurity concentration source/drain regions $S_{12}$ and $D_{12}$ having a conductivity type opposite to that of the substrate 10. Thereafter, the resist layer used for this process is removed.

The shallow source/drain regions $S_{12}$ and $D_{12}$ may be formed before the shallow source/drain regions $S_{11}$ and $D_{11}$ are formed. The shallow source/drain regions $S_{11}$, $S_{12}$, $D_{11}$, and $D_{12}$ may be formed by the same ion implantation process, when allowed. The shallow source/drain regions $S_{11}$ and $D_{11}$ and shallow source/drain regions $S_{12}$ and $D_{12}$ having opposite conductivity types may be formed to form CMOS circuit, by forming a well region or well regions before the isolation region shown in FIG. 1A is formed, or by other processes.

In the process shown in FIG. 1F, a side wall spacer forming insulating film 22 is formed on the substrate upper surface by CVD. The insulating film 22 may be a silicon oxide film having a thickness of about 250 nm.

In the process shown in FIG. 1G, the insulating film 22 is etched back by dry etching to form side wall spacers 22a and 22b on both sides of the gate electrode layer 20A, and side wall spacers 22c and 22d on both sides of the gate electrode layer 20B. The side wall spacers 22a to 22d are all made of left portions of the insulating film 22. This dry etching etches also the insulating films 16 and 12A to 12C exposed while the side wall spacers 22a to 22d are formed.

During the etching in the process shown in FIG. 1G, the time when the semiconductor surfaces in the element opening 16b and wafer periphery area WP are exposed is detected as an etching end point in accordance with a change in the emission spectrum intensity of etching byproducts.

Figure 3:
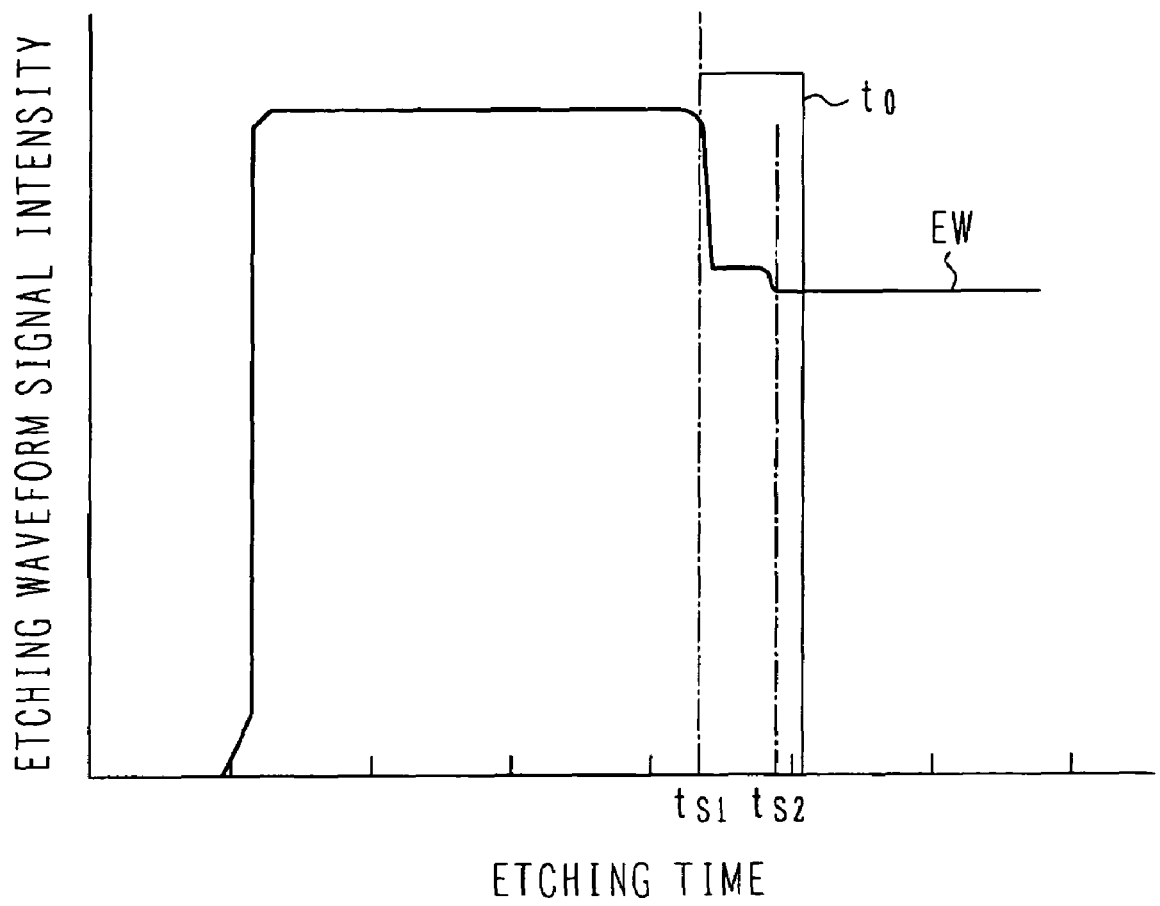
FIG. 3 is a graph showing a time change in an emission intensity detected with an etching monitor.

FIG. 3 shows a relation between an etching time and the intensity of an etching waveform signal EW. A time $t_{S1}$ is the time when an etching end point is detected for the exposed thin gate insulating film 12B and the thinnest dummy insulating film 12C. It can be understood from comparison between FIGS. 10 and 3 that a change in a signal intensity is larger in FIG. 3. This is because an etched opening area (etched opening area ratio) is increased by forming the thinnest dummy insulating film 12C in the wafer periphery area WP. It is therefore possible to reliably detect the etching end point at the time $t_{S1}$.

In the process shown in FIG. 1H, the dry etching continues during a predetermined period to time $t_O$ after the etching end point is detected at time $t_{S1}$ to perform over-etching and remove the exposed portion of the thick gate insulating film 12A to expose the semiconductor surface. In this case, since the over-etching time is set by using as a criterion the time $t_{S1}$ when the etching end point is reliably detected, the exposed portion of the insulating film 12A can be etched and removed reliably, without depending upon an unstable etching end point at time $t_{S2}$ for the insulating film 12A.

After the etching in the process shown in FIG. 1H, source/drain regions $S_{21}$ and $D_{21}$ are formed which have the same conductivity type as and a higher impurity concentration than that of the source/drain regions $S_{11}$ and $D_{11}$. To this end, impurity ions are implanted by using a resist layer covering the insulating film 16, the lamination structure of the gate insulating film 12A, gate electrode layer 20A and side wall spacers 22a and 22b, the element opening 16b and the wafer periphery area WP, and thereafter the resist layer is removed. Further, source/drain regions $S_{22}$ and $D_{22}$ are formed which have the same conductivity type as and a higher impurity concentration than that of the source/drain regions $S_{12}$ and $D_{12}$. To this end, impurity ions are implanted by using a resist layer covering the insulating film 16, the lamination structure of the gate insulating film 12B, gate electrode layer 20B and side wall spacers 22c and 22d, the element opening 16a and the wafer periphery area WP, and thereafter the resist layer is removed.

As described above, the source/drain regions $S_{21}$, $S_{22}$, $D_{21}$, and $D_{22}$ may be formed by the same ion implantation process, when allowed. The source/drain regions $S_{21}$ and $D_{21}$ and shallow source/drain regions $S_{22}$ and $D_{22}$ having opposite conductivity types may be formed to form CMOS circuit As shown in FIG. 11, a first interlayer insulating film IL1 of silicon oxide or the like is deposited on the semiconductor substrate, covering the transistors, via holes are formed by etching the first interlayer insulating film IL1, and conductive plugs PL1 are buried in the via holes, the conductive plugs being made of polysilicon, tungsten (via a barrier film such as TiN) or the like. First metal wirings M1 of aluminum alloy or the like connected to the conductive plugs PL1 are formed. A second interlayer insulating film IL2 of silicon oxide or the like is deposited on the first interlayer insulating film IL1, covering the first metal wirings M1, via holes are formed by etching the second interlayer insulating film IL2, and conductive plugs PL2 of tungsten (via a barrier film such as TiN) are buried in the via holes. Second metal wirings M2 of aluminum alloy or the like connected to the conductive plugs PL2 are formed. By using similar processes, a third interlayer insulating film IL3 of silicon oxide or the like is formed on the second interlayer insulating film IL2, covering the second metal wirings M2, via holes are formed by etching the third interlayer insulating film IL3, and conductive plugs PL3 of tungsten are buried in the via holes. Third metal wirings M3 of aluminum alloy or the like connected to the conductive plugs PL3 are formed. Although the third metal wirings M3 are shown as the uppermost wiring layer, the number of wiring layers may be increased or decreased if necessary. A cover film CL is formed covering the uppermost wiring layer M3, the cover layer being a lamination of a silicon oxide film/a silicon nitride film or the like.

The source/drain regions $S_{22}$ and $D_{22}$ may be formed before the source/drain regions $S_{21}$ and $D_{21}$ are formed, or may be formed at the same time if the conductivity type is the same as that of the source/drain regions $S_{21}$ and $D_{21}$. The over-etching process shown in FIG. 1H may be omitted to form the source regions $S_{21}$ and $S_{22}$ and drain regions $D_{21}$ and $D_{22}$ after the process shown in FIG. 1G. In this case, although the semiconductor surface in the element opening 16a is covered with the gate insulating film 12A, impurity ions are implanted via the gate insulating film 12A. Impurities implanted in the process shown in FIG. 1E and in the processes shown in FIGS. 1G and 1H are subjected to annealing to activate the impurities when appropriate.

In the above-described embodiment, the thinnest dummy insulating film having almost the same thickness as that of the thinnest gate insulating film in the chip area is formed in the wafer periphery area WP. The area where the thinnest dummy insulating film is formed is not limited to the wafer periphery area WP.

Figure 2B:
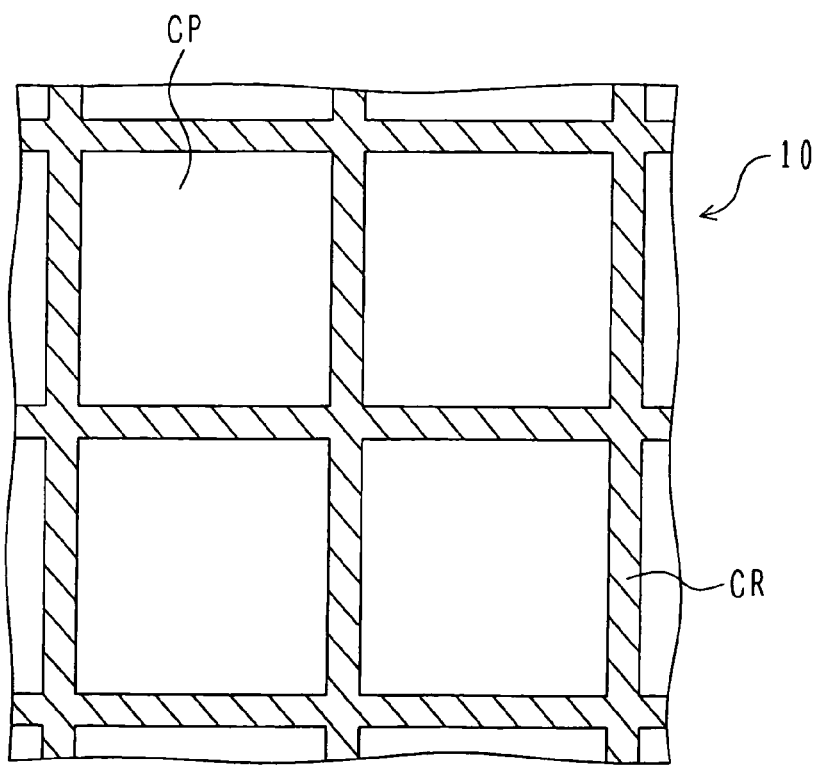

FIG. 2B is an enlarged view of a portion of the substrate (wafer) 10 shown in FIG. 2A. A number of chip areas CP are disposed in a matrix shape on the upper surface of the substrate 10, and as shown by hatching, an inter-chip area CR is defined. The inter-chip area CR includes a plurality of stripe areas extending in parallel at an equal interval along a vertical direction and a plurality of stripe areas extending in parallel at an equal interval along a horizontal direction. Each chip area CP corresponds to each of a plurality of square areas defined by the stripe areas along the vertical direction and the stripe areas along the horizontal direction, mutually crossing perpendicularly. Each stripe area is a scribe area along which the substrate 10 is scribed to separate each chip area as a semiconductor chip. The thinnest dummy insulating film can be formed in the inter-chip area CR.

Figure 4A:
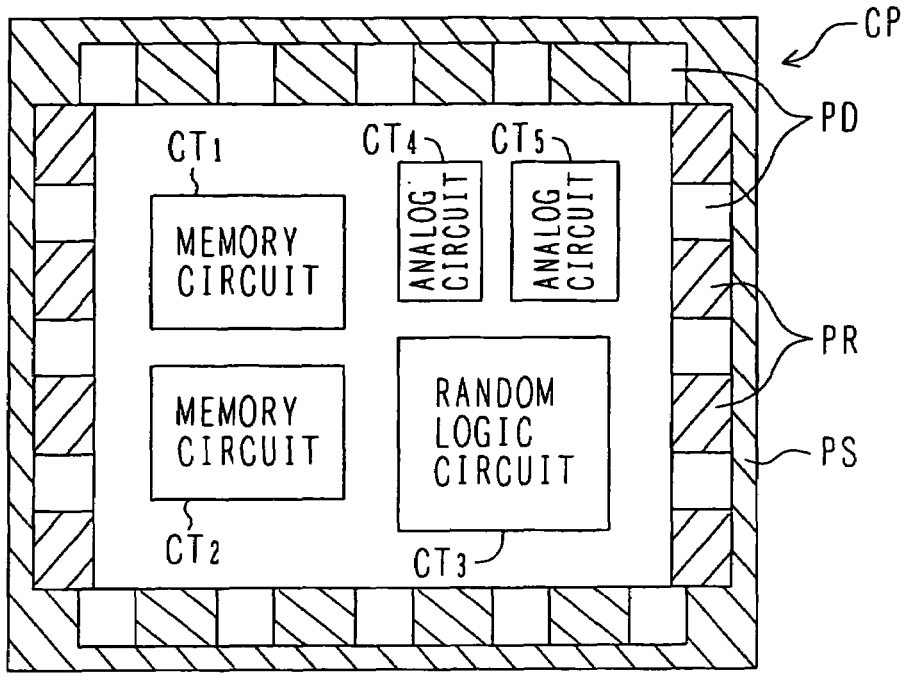
FIGS. 4A and 4B are plan views showing examples of the circuit layout in a chip area.

FIG. 4A shows an example of a circuit layout in one chip area CP. $CT_1$ and $CT_2$ represent memory circuits, $CT_3$ represents a random logic circuit, and $CT_4$ and $CT_5$ represent analog circuits. In the peripheral area of the chip area CP, for example, sixteen pad electrodes are disposed in the areas PD, surrounding the circuit area including $CT_1$ to $CT_5$. The area PD where each pad electrode is disposed is a pad area, and an area (area hatched right-side up) PR between adjacent pad areas PD is an inter-pad area. An area (area hatched left-side up) PS is an in-chip peripheral area defined between the frame layout of sixteen pad areas PD and the edge of the chip area CP. The thinnest dummy insulating film can be formed in any one of the pad area PD, inter-pad area PR and in-chip peripheral area PS.

Figure 4B:
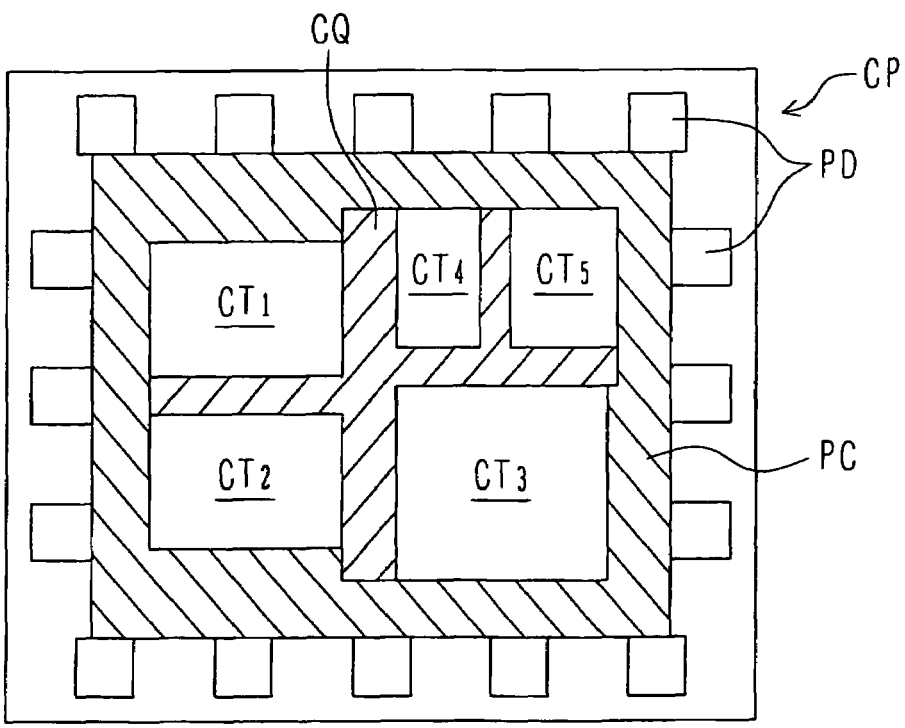

FIG. 4B shows a chip area CP similar to that shown in FIG. 4A, and areas similar to those shown in FIG. 4A are represented by like symbols. An area (an area hatched right-side up) CQ between adjacent circuits such as between $CT_1$ and $CT_2$, between $CT_1$ and $CT_4$ and between $CT_2$ and $CT_3$ is an inter-circuit area. An area (area hatched left-side up) PC is an inter-pad-circuit area defined between the frame layout of sixteen pad areas PD and the circuit area including $CT_1$ to $CT_5$. The thinnest dummy insulating film can be formed in any one of the inter-circuit area CQ and inter-pad-circuit area PC. For the purposes of simplicity, wirings are not shown and omitted in FIGS. 4A and 4B.

Figure 5:
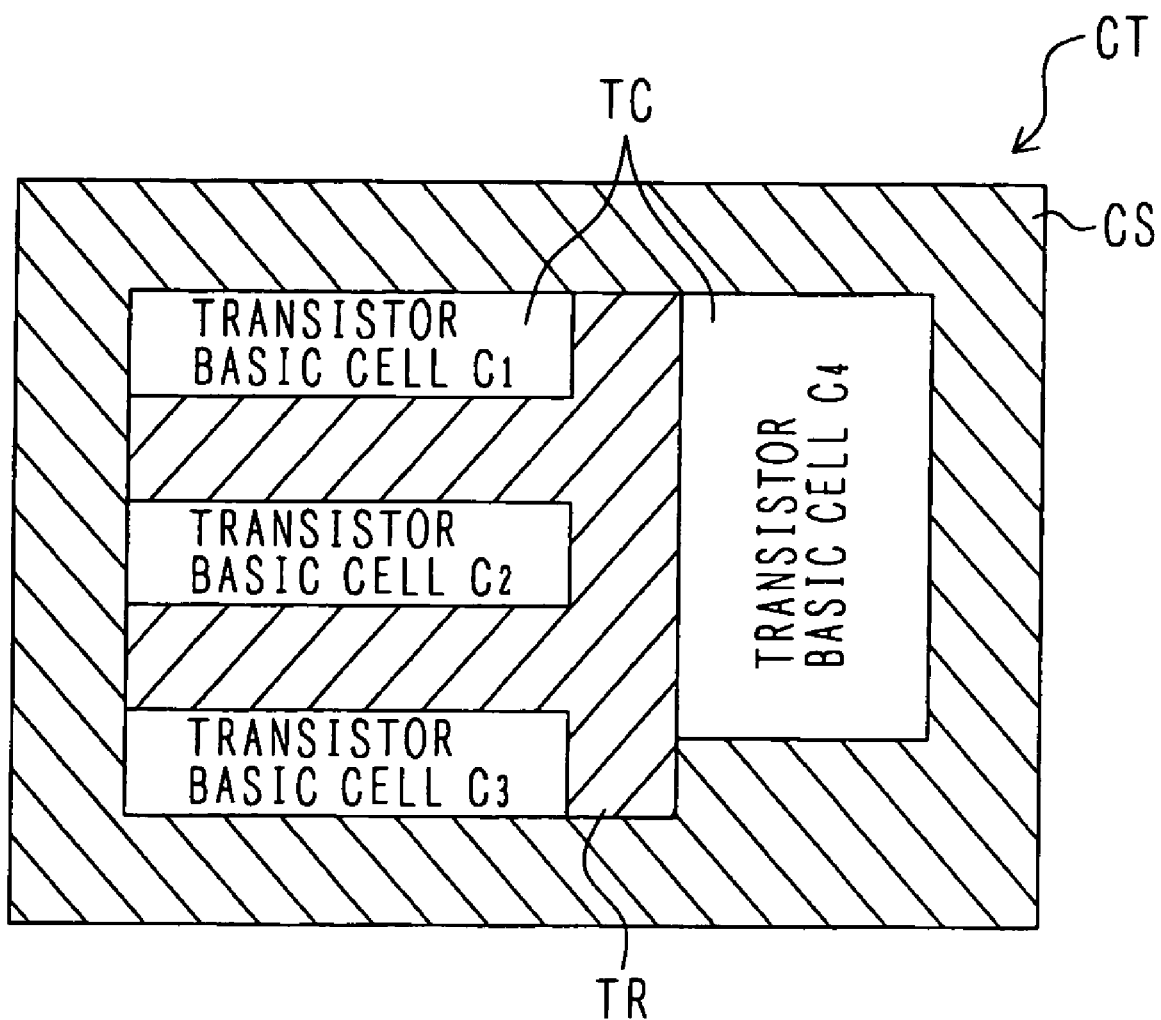
FIG. 5 is a plan view showing an example of the layout of fundamental transistor cells in a circuit.

FIG. 5 shows an example of a transistor basic cell layout of one circuit CT in the chip area CP shown in FIGS. 4A and 4B. For example, four transistor basic cells $C_1$ to $C_4$ are formed in the circuit CT as shown. An area TC where each basic cell is formed is an in-cell area. An area (area hatched right-side up) TR between adjacent basic cells such as between $C_1$ and $C_2$ and between $C_1$ and $C_4$ is an inter-cell area. An area (area hatched left-side up) CS between the cell area including four basic cells $C_1$ to $C_4$ and the edge of the circuit CT is a circuit peripheral area CS. The thinnest dummy insulating film can be formed in any one of the in-cell area TC, i.e., an area other than elements in the in-cell area, inter-cell area TR and circuit peripheral area CS.

In the following, description will be made on forming the thinnest dummy insulating film in the pad area PD shown in FIG. 4A.

Figure 6A:
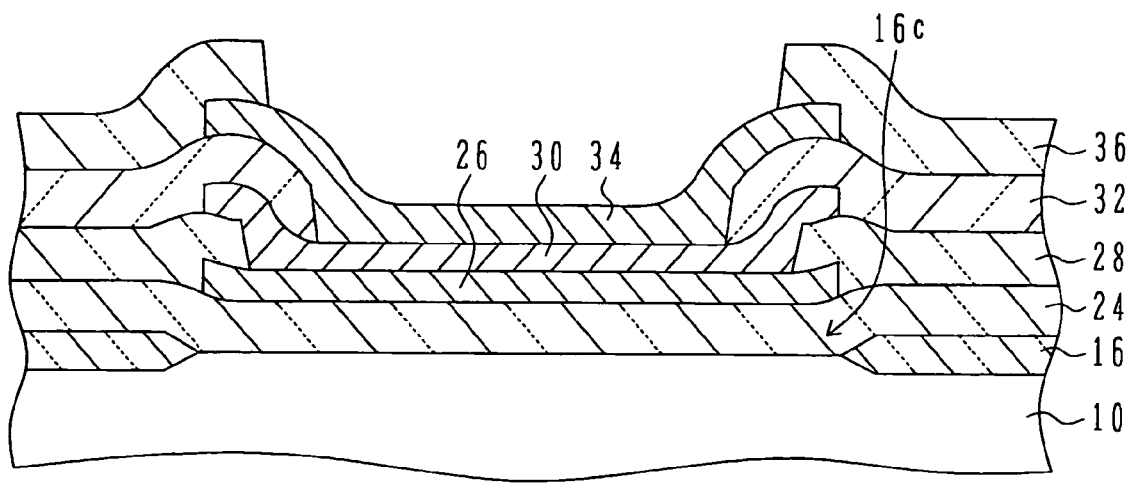
FIGS. 6A, 6B and 6C are a cross sectional view showing an example of a pad electrode structure, a table showing change in an effective detection area depending upon a chip size and the number of pads, and a graph showing a relation between a chip size and increase of an effective detection area.

FIG. 6A shows an example of a pad electrode structure. In this example, the thinnest dummy insulating film is formed in all the sixteen pad areas PD shown in FIG. 4A. For simplicity, the pad electrode structure in one pad area is shown in FIG. 6A.

An isolation film 16 is formed on the upper surface of the substrate 10 in the isolation process shown in FIG. 1A in such a manner that the isolation film has pad openings 16c. The method of forming the pad openings 16c is the same as the method of forming element openings such as the element opening 16a.

Next, in the process shown in FIG. 1B, an insulating film similar to the insulating film 12C' is formed on the semiconductor surface in the pad opening 16c, and removed in the process shown in FIG. 1C. Thereafter, in the process shown in FIG. 1D, the thinnest dummy insulating film similar to the insulating film 12C is formed on the semiconductor surface in the pad opening 16c, and removed in the dry etching process shown in FIG. 1G. The semiconductor surface is therefore exposed in the pad opening 16c. Exposure of wide pad areas helps detection of etching end point.

After the source regions $S_2$, and $S_{22}$ and drain regions $D_{21}$ and $D_{22}$ are formed in the processes shown in FIG. 1G or 1H, an interlayer insulating film 24 is formed on the isolation film 16, covering the MOS transistors in the element openings 16a and 16b and the semiconductor surface in the pad opening 16c. Formed sequentially thereafter on the insulating film 24 by well-known methods are a first-layer metal wiring layer 26, an interlayer insulating film 28, a second-layer metal wiring layer 30, an interlayer insulating film 32, a metal electrode layer 34 and a protective insulating film 36. The wiring layers 26 and 30 and electrode layer 34 constitute a bonding pad to be connected to a bonding wire or the like.

If the thinnest dummy insulating film described above is formed on the semiconductor surface in the pad opening 16c in the process shown in FIG. 1D, the area where the thinnest dummy insulating films are formed in the sixteen wafer periphery pad areas PD shown in FIG. 4A is 16S where S is an area where the thinnest dummy insulating film is formed in one pad area shown in FIG. 6A. The area where the thinnest dummy insulating films are formed on the substrate (wafer) 10 shown in FIG. 2A is 16S×N where N is the number of chip areas CP in the substrate. In the dry etching process shown in FIG. 1G, in addition to an increase in the etched opening area provided by the thinnest dummy insulating film formed in the wafer periphery area WP, the etched opening area is increased by an area corresponding to 16S×N provided by the thinnest dummy insulating films formed in the pad areas PD in the wafer. It is therefore possible to detect an etching end point at a better precision.

As the pad electrode structure shown in FIG. 6A is compared to the pad electrode structure shown in FIG. 11, since the isolation film 16 is not formed in the pad opening 16c, a parasitic capacitance between the substrate 10 and pad electrode increases slightly. However, since a thickness of the first-layer interlayer insulating film 24 is sufficiently thicker than the isolation film 16 because of device miniaturization, an increase in the parasitic capacitance can be made small. For example, if a thickness of the isolation film 16 is 250 nm and a thickness of the interlayer insulating film is 1000 nm, an increase in the parasitic capacitance can be suppressed to 1.25 times=(250+1000)/1000.

An increase in the area (effective detection area) contributed to etching end point detection is estimated as shown in Table of FIG. 6B if the thinnest dummy insulating film is formed in the pad area as described with reference to FIG. 6A, assuming that a chip occupying area ratio (corresponding to a ratio occupied by the chip exposure area CE) in the wafer shown in FIG. 2A is 90%.

Figures 6B, 6C:
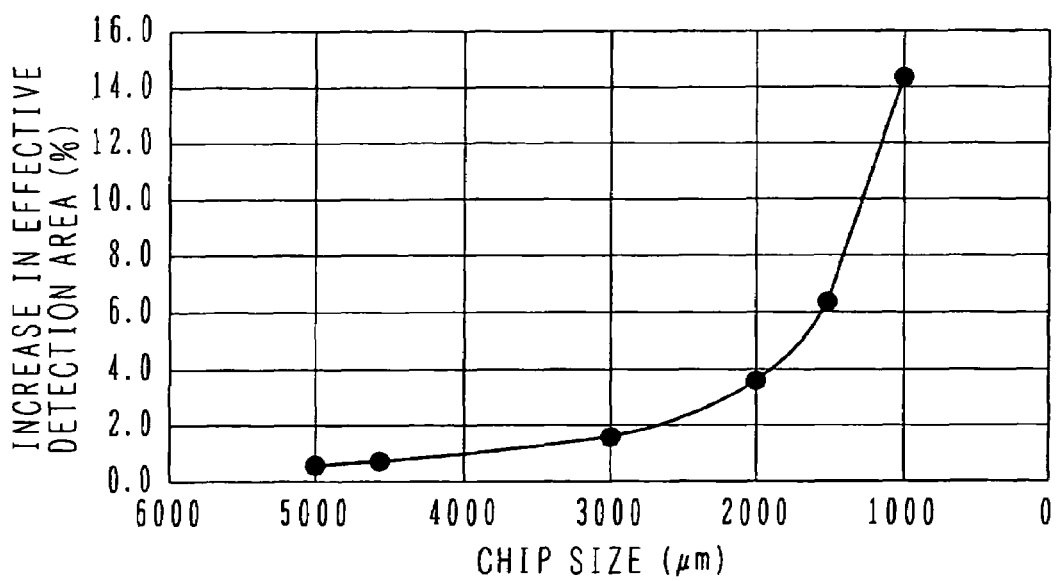

In Table of FIG. 6B, "chip size" indicates a length of one side of the chip area, "number of pads" indicates the number of pad electrodes per one chip area, "pad size" indicates a length of one side of a pad electrode, and "increase" indicates an increase in the effective detection area.

FIG. 6C shows a relation between a chip size and an increase in the effective detection area obtained by the data of the conditions 1 to 7 shown in Table of FIG. 6B. It can be understood from FIGS. 6B and 6C that the effective detection area increases as the chip size reduces. It can therefore be said that the approach to forming the thinnest dummy insulating film in the pad area (an area under the pad electrode) is effective for small chip size devices.

In the example described with reference to FIG. 6A, although the thinnest dummy insulating film is formed in all of sixteen pad areas PD, the thinnest dummy insulating film may be formed in pad areas less than sixteen areas. As described with reference to FIG. 6A, if the thinnest dummy insulating film is formed in the pad areas PD, the thinnest dummy insulating film may be formed in one or plural areas among the inter-chip area CR shown in FIG. 2B, the inter-pad area PR and in-chip peripheral area PS shown in FIG. 4A, the inter-circuit area CQ and inter-pad-circuit area PC shown in FIG. 4B, and the intra-cell area TC, inter-cell area TR and circuit peripheral area CS shown in FIG. 5.

In the following, description will be made on forming the thinnest dummy insulating film in the isolation region in various areas.

FIGS. 7A to 7E illustrate an example of design and manufacture processes. In this example, a computer aided design (CAD) approach is used. Processes such as Steps 40 to 118 and Step 124 can be executed by a computer.

At Step 40 an area where the thinnest dummy insulating film (hereinafter called "thinnest dummy insulating film forming area") is formed, is designated. To this end, an image of areas such as shown in FIGS. 2B, 4A, 4B and 5 where the thinnest dummy insulating film can be formed is displayed on a computer screen and a designer designates the thinnest dummy insulating film forming area by manipulating a mouse, a keyboard or the like. In this case, the designer inputs a size X in an X-direction and a size Y in a Y-direction of the isolation region where the thinnest dummy insulating film forming area is disposed, and the isolation region design minimum size MIN, into the computer.

Figure 8A:
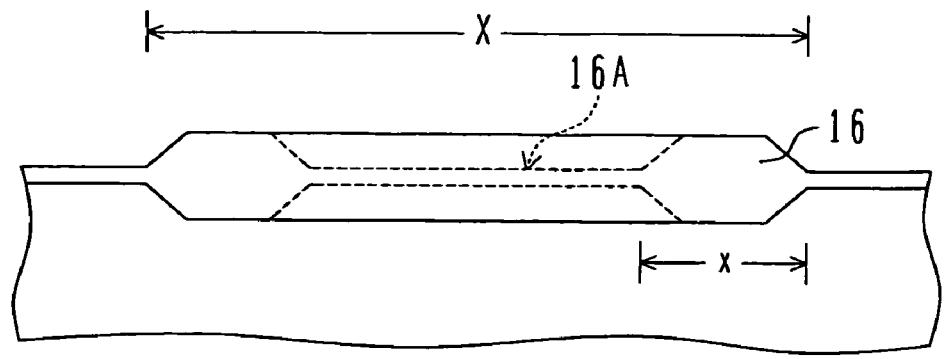
FIGS. 8A and 8B are a cross sectional view and a plan view of an area where a thinnest dummy insulating film is formed.
Figure 8B:
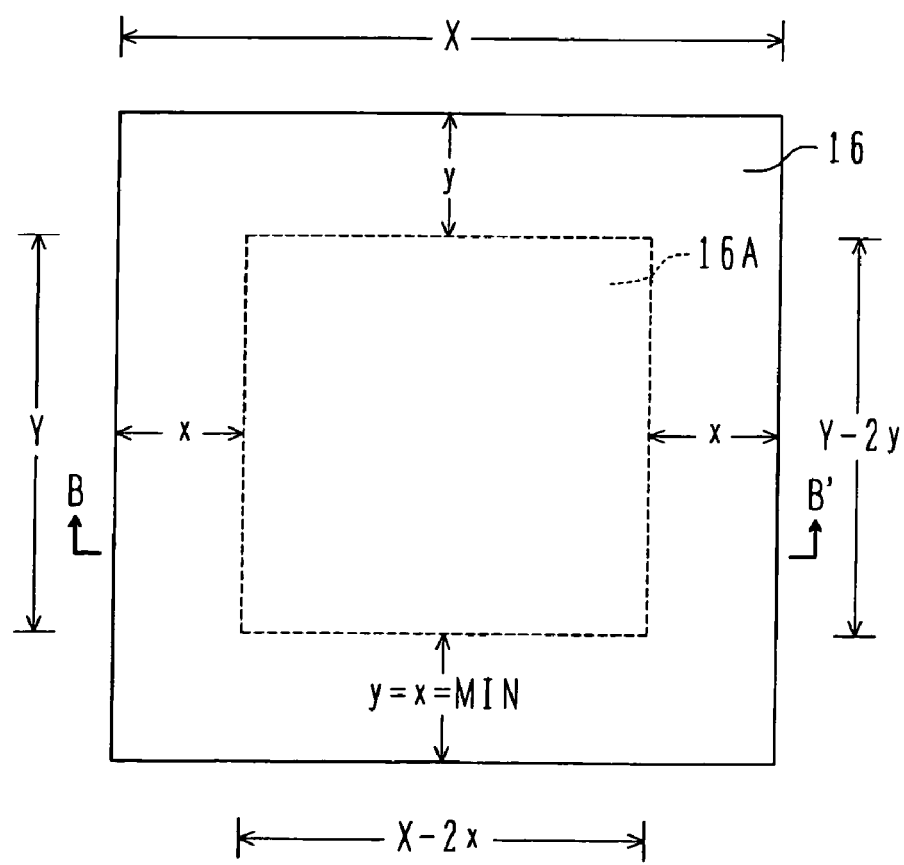

FIGS. 8A and 8B show a relation between the isolation region and the thinnest dummy insulating film forming area. The isolation region is an area where an isolation film 16 is formed. In this example, it is assumed that a thinnest dummy insulating film forming area 16A is disposed in the isolation region whose size X in the X-direction and size Y in the Y-direction are both larger than twice the isolation region design minimum size MIN (2MIN). The thinnest dummy insulating film forming area (X−2x)×(Y−2y) is set where x=y=MIN. FIG. 8A is a cross sectional view taken along line B-B' of FIG. 8B.

If the intra-cell area TC in the circuit TC shown in FIG. 5 is to be designated as the thinnest dummy insulating film forming area at Step 40, the designer inputs one of the numbers 1 to $N_1$ ($N_1$>1) of transistor basic cells in the circuit CT shown in FIG. 5 into the computer. If a circuit in the chip area CP shown in FIGS. 4A and 4B is to be designated, the designer inputs one of the numbers 1 to $N_2$ ($N_2$>1) of circuits in the chip area CP into the computer. The designer may designate on the computer screen the wafer periphery area WP such as shown in FIG. 2A as the thinnest dummy insulating film forming area.

At Step 42 it is judged whether the thinnest dummy insulating film forming area is in the basic cell. If this judgement result is affirmative (Y), then the process of a first loop from Step 44 to Step 50 is executed. In this process, the processes at Steps 46 and 48 are executed for each of the basic cells 1 to $N_1$.

At Step 46 it is judged whether X>2MIN and Y>2MIN. If this judgement result is affirmative (Y), then at Step 48 a new thinnest dummy insulating film forming area (X−2x)×(Y−2y) where x=MIN and y=MIN is set to generate area data representative of this area. The set area is designated as a thinnest dummy insulating film forming area (a). If the judgement result at Step 46 is negative (N), the process at Step 48 is not executed. For example, if $N_1$=4 such as shown in FIG. 5 and the judgement result at Step 46 is affirmative (Y) for each of the basic cells 1 to $N_1$, four intra-cell areas TC are designated as the thinnest dummy insulating film forming areas (a).

After the process of the first loop is completed, at Step 52 one or plural intra-cell designated areas TC are displayed on the computer screen as the thinnest dummy insulating film forming areas (a).

Figure 7A:
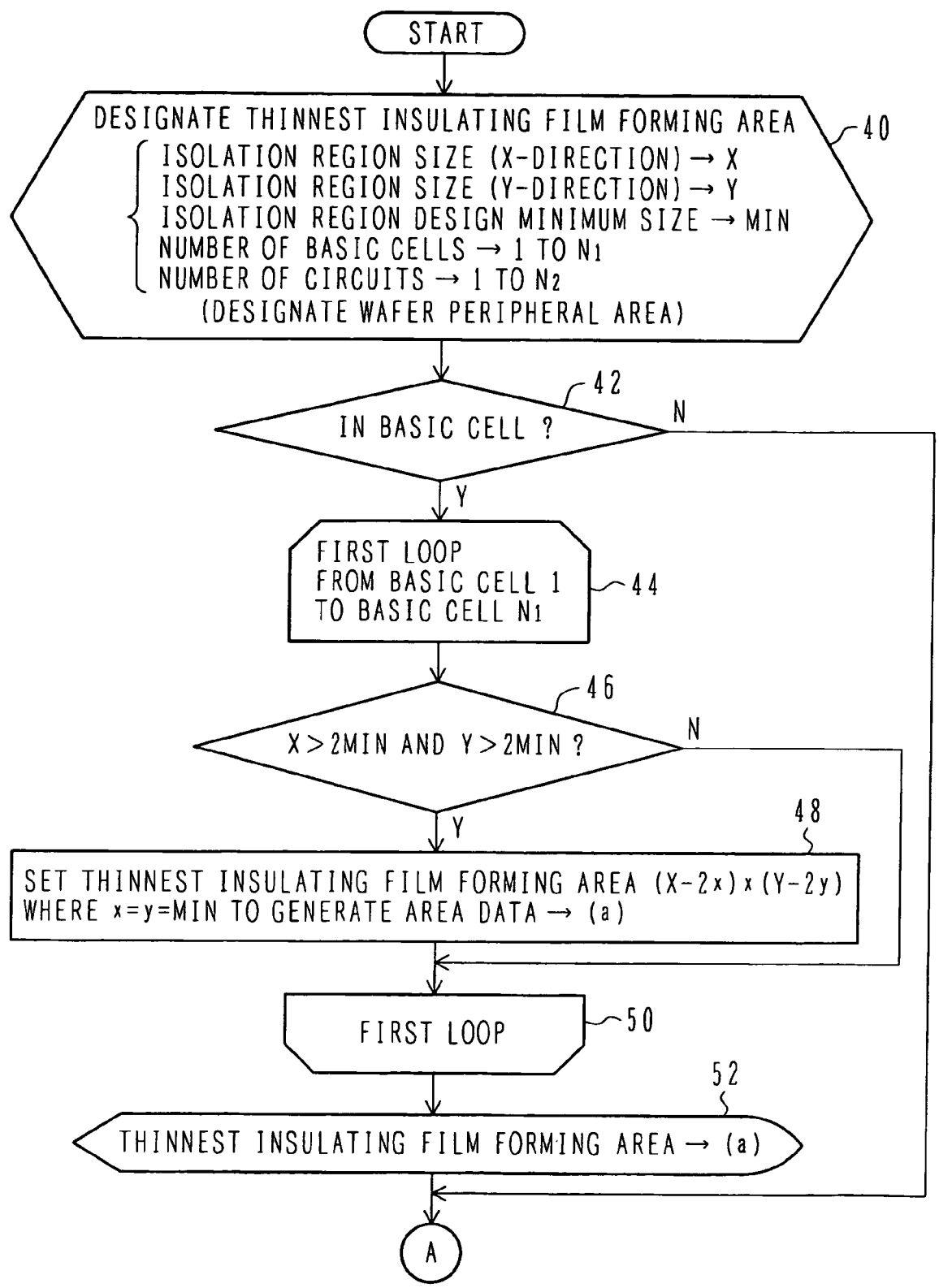
FIGS. 7A to 7E show a process flow chart illustrating a flow of forming side wall spacers.
Figure 7B:
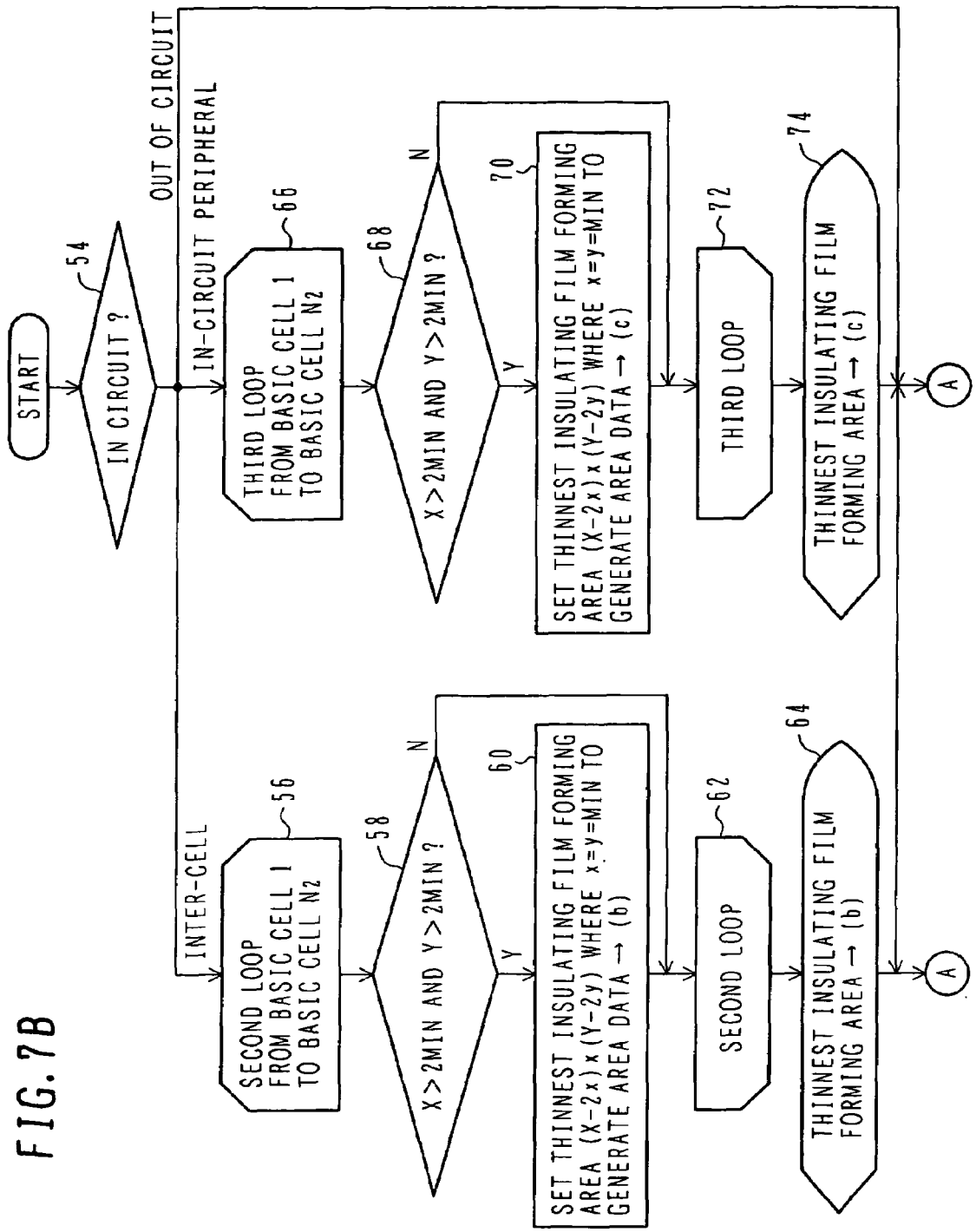

If the process at Step 52 is completed or the judgement result at Step 42 is negative (N), the flow advances to Step 54 of FIG. 7B. At Step 54 it is judged whether the thinnest dummy insulating film forming area is in the circuit. If in the circuit, it is judged whether the thinnest dummy insulating film forming area is the inter-cell area TR or the circuit peripheral area CS.

If the judgement result at Step 54 indicates the inter-cell area TR, the process of a second loop from Step 56 to Step 62 is executed. In this process, Steps 58 and 60 are executed for each of the circuits 1 to $N_2$.

At Step 58 it is judged if X>2MIN and Y>2MIN. If this judgement result is affirmative (Y), then at Step 60 a new thinnest dummy insulating film forming area (X−2x)×(Y−2y) where x=MIN and y=MIN is set to generate area data representative of this area. The set area is designated as a thinnest dummy insulating film forming area (b). If the judgement result at Step 58 is negative (N), the process at Step 60 is not executed. For example, if $N_2$=5 such as shown in FIGS. 4A and 4B and the judgement result at Step 58 is affirmative (Y) for each of the circuits 1 to $N_2$, five inter-cell areas TR are designated as the thinnest dummy insulating film forming areas (b).

After the process of the second loop is completed, at Step 64 one or plural inter-cell designated areas TR are displayed on the computer screen as the thinnest dummy insulating film forming areas (b).

If the judgement result at Step 54 indicates the circuit peripheral area CS, a process of a third loop at Step 66 to Step 72 is executed. In this process, Steps 68 and 70 are executed for each of the circuits 1 to $N_2$.

At Step 68 it is judged if X>2MIN and Y>2MIN. If this judgement result is affirmative (Y), then at Step 70 a new thinnest dummy insulating film forming area (X−2x)×(Y−2y) where x=MIN and y=MIN is set to generate area data representative of this area. The set area is designated as a thinnest dummy insulating film forming area (c). If the judgement result at Step 68 is negative (N), the process at Step 70 is not executed. For example, if $N_2$=5 such as shown in FIGS. 4A and 4B and the judgement result at Step 68 is affirmative (Y) for each of the circuits 1 to $N_2$, five circuit peripheral areas CS are designated as the thinnest dummy insulating film forming areas (c).

After the process of the third loop is completed, at Step 74 one or plural designated circuit peripheral areas CS are displayed on the computer screen as the thinnest dummy insulating film forming areas (c).

Figure 7C:
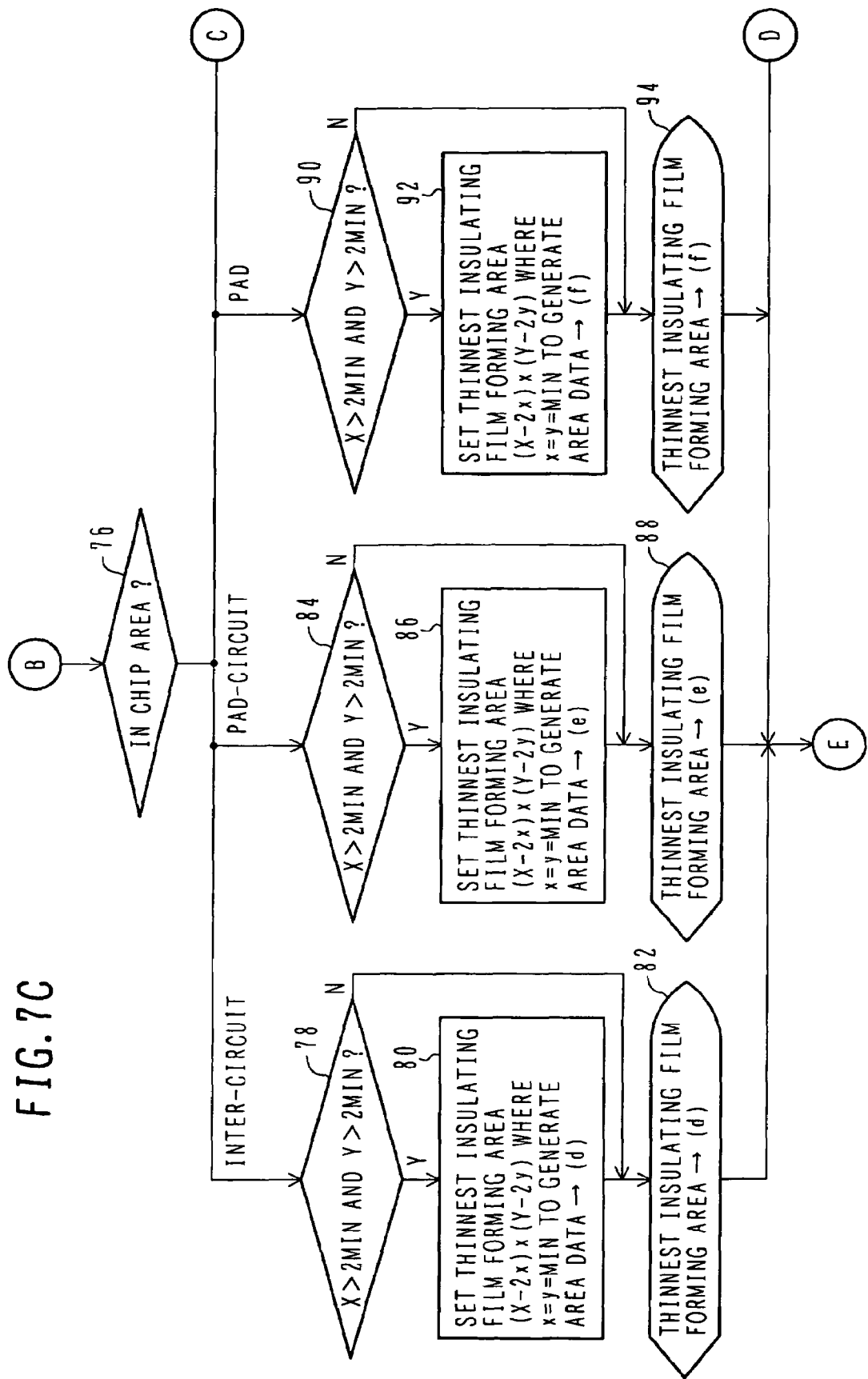

After the process at Step 64 or 74 is completed or the judgement result at Step 54 indicates out of the circuit, the flow advances to Step 76 of FIG. 7C. At Step 76 it is judged whether the thinnest dummy insulating film forming area is in the chip area. If in the chip area, it is judged whether the thinnest dummy insulating film forming area is the inter-circuit area CQ or inter-pad-circuit area PC such as shown in FIG. 4B or the pad area PD, inter-pad area PR or in-chip peripheral area PS such as shown in FIG. 4A.

If the judgement result at Step 76 indicates the inter-circuit area CQ, then at Step 78 it is judged if X>2MIN and Y>2MIN. If this judgement result is affirmative (Y), then at Step 80 a new thinnest dummy insulating film forming area (X−2x)×(Y−2y) where x=MIN and y=MIN is set to generate area data representative of this area. The set area is designated as a thinnest dummy insulating film forming area (d).

If the process at Step 80 is completed or the judgement result at Step 78 is negative (N), then at Step 82 the inter-circuit area CQ is displayed on the computer screen as the thinnest dummy insulating film forming area (d).

If the judgement result at Step 76 is the inter-pad-circuit area PC, then at Step 84 it is judged whether X>2MIN and Y>2MIN. If this judgement result is affirmative (Y), then at Step 86 a new thinnest dummy insulating film forming area (X−2x)×(Y−2y) where x=MIN and y=MIN is set to generate area data representative of this area. The set area is designated as a thinnest dummy insulating film forming area (e).

If the process at Step 86 is completed or the judgement result at Step 84 is negative (N), then at Step 88 the inter-pad-circuit area PC is displayed on the computer screen as the thinnest dummy insulating film forming area (e).

If the judgement result at Step 76 is the pad area PD, then at Step 90 it is judged whether X>2MIN and Y>2MIN. If this judgement result is affirmative (Y), then at Step 92 a new thinnest dummy insulating film forming area (X−2x)×(Y−2y) where x=MIN and y=MIN is set to generate area data representative of this area. The set area is designated as a thinnest dummy insulating film forming area (f).

If the process at Step 92 is completed or the judgement result at Step 90 is negative (N), then at Step 94 the pad area PD is displayed on the computer screen as the thinnest dummy insulating film forming area (f).

Figure 7D:
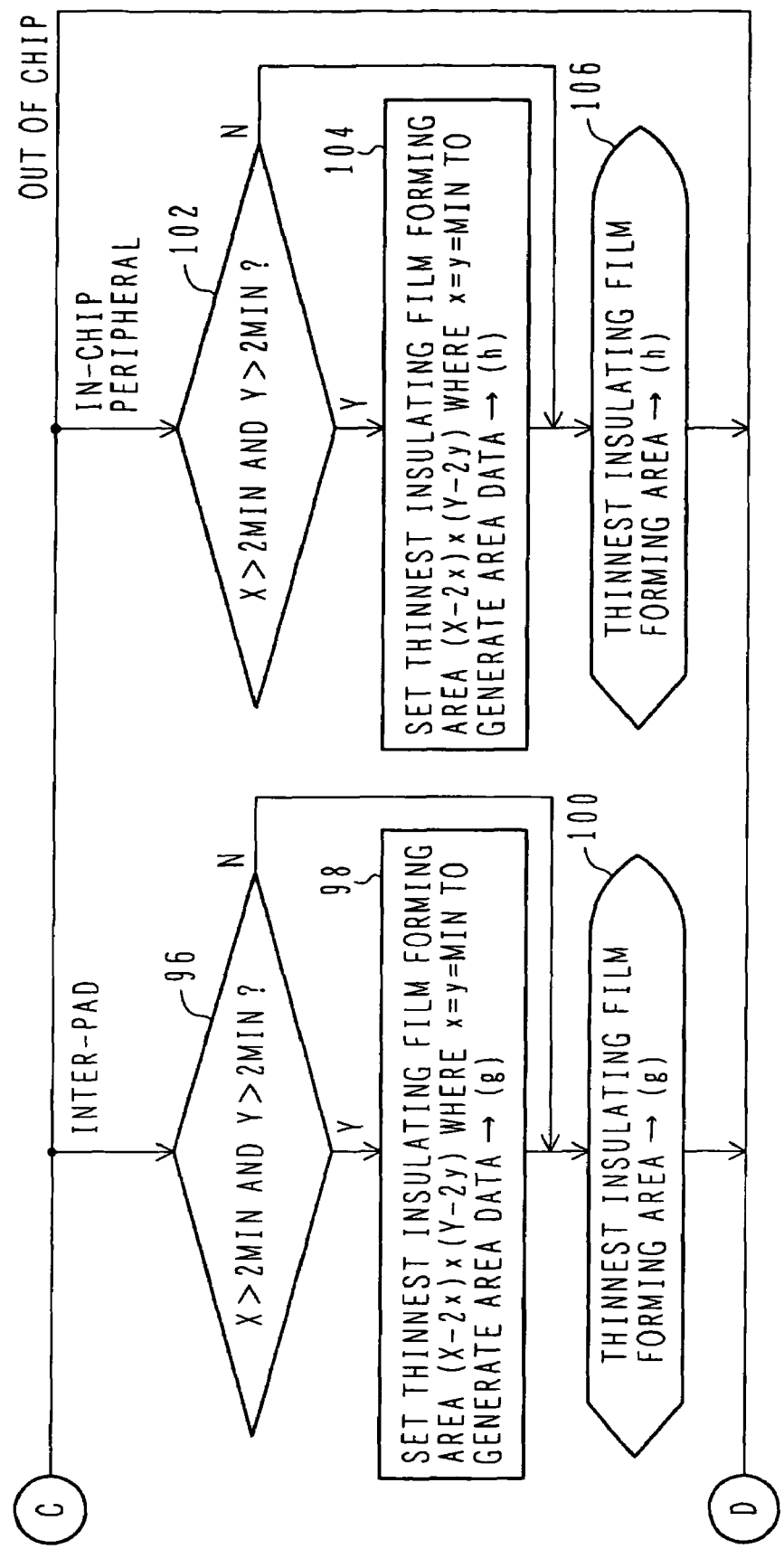

If the judgement result at Step 76 is the inter-pad area PR, then at Step 96 shown in FIG. 7D it is judged whether X>2MIN and Y>2MIN. If this judgement result is affirmative (Y), then at Step 92 a new thinnest dummy insulating film forming area (X−2x)×(Y−2y) where x=MIN and y=MIN is set to generate area data representative of this area. The set area is designated as a thinnest dummy insulating film forming area (g).

If the process at Step 98 is completed or the judgement result at Step 96 is negative (N), then at Step 100 the inter-pad area PR is displayed on the computer screen as the thinnest dummy insulating film forming area (g).

If the judgement result at Step 76 is the in-chip peripheral area PS, then at Step 102 it is judged whether X>2MIN and Y>2MIN. If this judgement result is affirmative (Y), then at Step 104 a new thinnest dummy insulating film forming area (X−2x)×(Y−2y) where x=MIN and y=MIN is set to generate area data representative of this area. The set area is designated as a thinnest dummy insulating film forming area (h).

If the process at Step 104 is completed or the judgement result at Step 102 is negative (N), then at Step 106 the in-chip peripheral area PS is displayed on the computer screen as the thinnest dummy insulating film forming area (h).

Figure 7E:
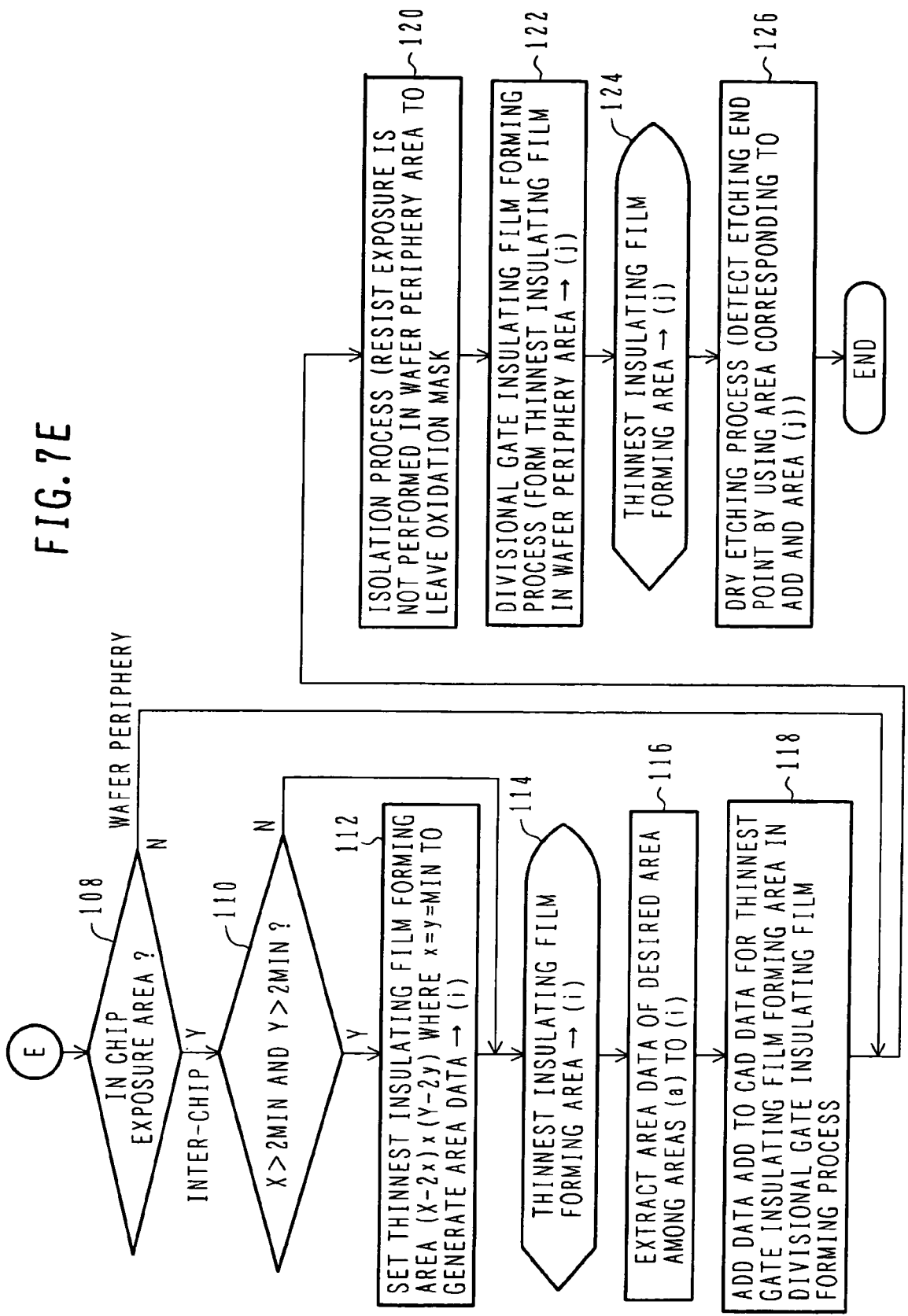

If the process at Step 82, 88, 94, 100 or 106 is completed, then at Step 108 shown in FIG. 7E it is judged whether the thinnest dummy insulating film forming area is in the chip exposure area. If this judgement result is affirmative (Y), then at Step 110 it is judged whether X>2MIN and Y>2MIN. If this judgement result is affirmative (Y), then at Step 112 a new thinnest dummy insulating film forming area (X−2x)×(Y−2y) where x=MIN and y=MIN is set to generate area data representative of this area. The set area is designated as a thinnest dummy insulating film forming area (i).

If the process at Step 112 is completed or the judgement result at Step 110 is negative (N), then at Step 114 the inter-chip area CR is displayed on the computer screen as the thinnest dummy insulating film forming area (i).

If the process at Step 111 is completed, then at Step 116 the designer selects a desired area from the thinnest dummy insulating film forming areas (a) to (i) displayed on the computer screen. In this case, the thinnest dummy insulating film forming areas not selected are deleted from the computer screen. The computer extracts the data of the area selected by the designer and adds the area data to CAD data as additional data ADD. At Step 118 the additional data ADD in the CAD data is used for the thinnest gate insulating film forming area in the divisional gate insulating film forming process.

At Step 120 the isolation process is executed in the manner described with reference to FIG. 1A. In this case, resist exposure is not performed in the wafer periphery area WP to leave the oxidation mask layer and prevent the growth of the isolation film.

Next, at Step 122 the divisional gate insulating film forming process is executed in the manner described with reference to FIGS. 1B, 1C and 1D. When the thinnest gate insulating film for which the additional data ADD was added at Step 118 is formed, the thinnest dummy insulating film having almost the same thickness as that of the thinnest gate insulating film is formed in the wafer periphery area. The wafer periphery area is designated as the thinnest dummy insulating film forming area (j). At Step 124 the wafer periphery area WP is displayed on the computer screen as the thinnest dummy insulating film forming area (j). In this case, one or plural areas selected at Step 116 among the thinnest dummy insulating film forming areas (a) to (i) and the thinnest dummy insulating film forming area (j) are displayed on the computer screen.

Thereafter, at Step 126 the dry etching process is executed in the manner described with reference to FIGS. 1G and 1H. In this case, the etching end point is detected by utilizing the thinnest dummy insulating film forming area corresponding to the additional data ADD and the thinnest dummy insulating film forming area (j).

If the wafer periphery area is designated at Step 40 as the thinnest dummy insulating film forming area, the judgement result at Step 108 is negative (N) and the processes from Step 120 to Step 126 are executed in the manner similar to that described above. In this case, only the thinnest dummy insulating film forming area (j) is used for the etching end point detection.

The present invention has been described in connection with the preferred embodiments. The invention is not limited only to the above embodiments. It will be apparent to those skilled in the art that other various modifications, improvements, combinations, and the like can be made.

What is claimed is:

1. A semiconductor device manufacture method comprising the steps of:
   (a) forming an isolation region surrounding and defining each of a plurality of active regions and each of a plurality of dummy regions of a semiconductor substrate, said active regions being regions for forming transistors, said dummy regions being regions in which no transistors are formed;
   (b) forming thin insulating films on said active regions and dummy regions;
   (c) forming a gate electrode on the thin insulating films in said active regions;
   (d) implanting impurity ions in said active regions by using said gate electrodes as a mask to form shallow source/drain regions;
   (e) depositing a spacer insulating film on said semiconductor substrate, said spacer insulating film covering said gate electrodes;
   (f) anisotropically etching said spacer insulating film, detecting as an etching end point a time when surfaces of said semiconductor substrate are exposed in said active regions and dummy regions, wherein an area of thin insulating film is increased by forming a thinnest insulating film in the dummy region, and leaving side wall spacers on side walls of each of said gate electrodes; and
   (g) implanting impurity ions into said active regions by using said gate electrodes and side wall spacers as a mask to form low resistivity and deep source/drain regions in said active regions.

2. The semiconductor device manufacture method according to claim 1, wherein said step (f) detects an etching end point through monitoring a change in an emission spectrum intensity of an etching byproduct.

3. The semiconductor device manufacture method according to claim 1, wherein said step (f) performs over-etching after the etching end point is detected.

4. The semiconductor device manufacture method according to claim 1, wherein:
   said step (b) forms thin insulating films having a plurality of thicknesses in a plurality of active regions and a dummy insulating film having a thickness equivalent to a thinnest thin insulating film in said dummy regions; and
   said step (f) detects as the etching end point a time when surfaces of said semiconductor substrate is exposed by etching said thinnest thin insulating film and said dummy insulating film.

5. The semiconductor device manufacture method according to claim 1, wherein said dummy regions include an area other than chip forming areas of said semiconductor substrate.

6. The semiconductor device manufacture method according to claim 1, wherein said dummy regions include an area spaced apart from each of said active regions in in-chip area of said semiconductor substrate.

7. The semiconductor device manufacture method according to claim 6, wherein said dummy regions include a pad forming area disposed in said in-chip area.

8. The semiconductor device manufacture method according to claim 1, wherein said dummy regions include an area between chip areas of said semiconductor substrate.

9. The semiconductor device manufacture method according to claim 1, wherein said dummy regions include an area selected in said isolation region.

10. The semiconductor device manufacture method according to claim 1, wherein said dummy regions include an inter-cell area in an in-chip area of said semiconductor substrate.

11. The semiconductor device manufacture method according to claim 1, wherein said semiconductor substrate is a silicon substrate and said thin insulating film and spacer insulating film are silicon oxide films.

* * * * *